US008498164B1

(12) United States Patent
Hollmer et al.

(10) Patent No.: US 8,498,164 B1
(45) Date of Patent: Jul. 30, 2013

(54) VARIABLE IMPEDANCE MEMORY DEVICE BIASING CIRCUITS AND METHODS

(75) Inventors: Shane Charles Hollmer, Grass Valley, CA (US); Nad Edward Gilbert, Gilbert, AZ (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/594,756

(22) Filed: Aug. 24, 2012

Related U.S. Application Data

(63) Continuation of application No. 12/566,790, filed on Sep. 25, 2009, now Pat. No. 8,274,842.

(60) Provisional application No. 61/194,406, filed on Sep. 25, 2008.

(51) Int. Cl.
*G11C 7/10* (2006.01)

(52) U.S. Cl.
USPC ...... 365/189.04; 365/146; 365/148; 365/164; 365/178; 365/189.16; 365/189.17; 365/189.07; 365/230.06

(58) Field of Classification Search
USPC .................... 365/189.04, 146, 148, 164, 178, 365/189.16, 189.17, 189.07, 230.06
See application file for complete search history.

(56) References Cited

U.S. PATENT DOCUMENTS

| 2006/0250839 A1* | 11/2006 | Gilbert .......................... 365/163 |
| 2007/0171698 A1* | 7/2007 | Hoenigschmid et al. ..... 365/148 |
| 2010/0006813 A1* | 1/2010 | Xi et al. ............................ 257/4 |

OTHER PUBLICATIONS

U.S. Appl. No. 12/566,790, filed Sep. 25, 2009.

* cited by examiner

*Primary Examiner* — Fernando Hidalgo

(57) ABSTRACT

An integrated circuit can include at least one programmable metallization cell (PMC) comprising an ion conducting material and a metal dissolvable in the ion conducting material, selectively connected to a shunt node; and a biasing circuit comprising a current source coupled to the shunt node configurable to provide a first current in a first type operation, and a voltage regulator coupled to the shunt node configured to regulate a potential at the shunt node; wherein in the first type operation, the voltage regulator shunts current with respect to the shunt node in a same direction as a current flow of the at least one PMC.

13 Claims, 16 Drawing Sheets

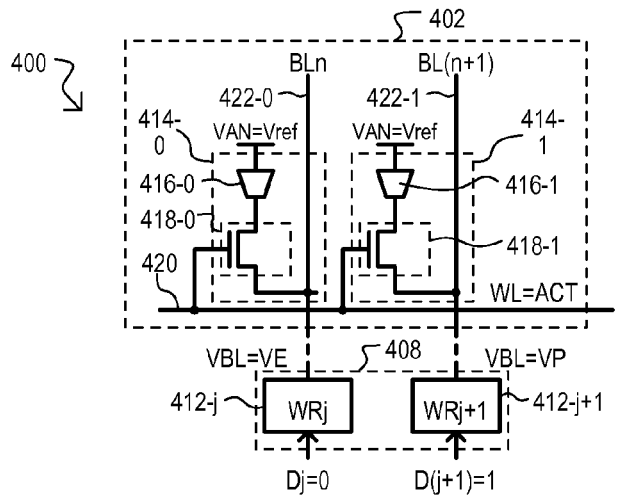
FIG. 4A
FIG. 4B
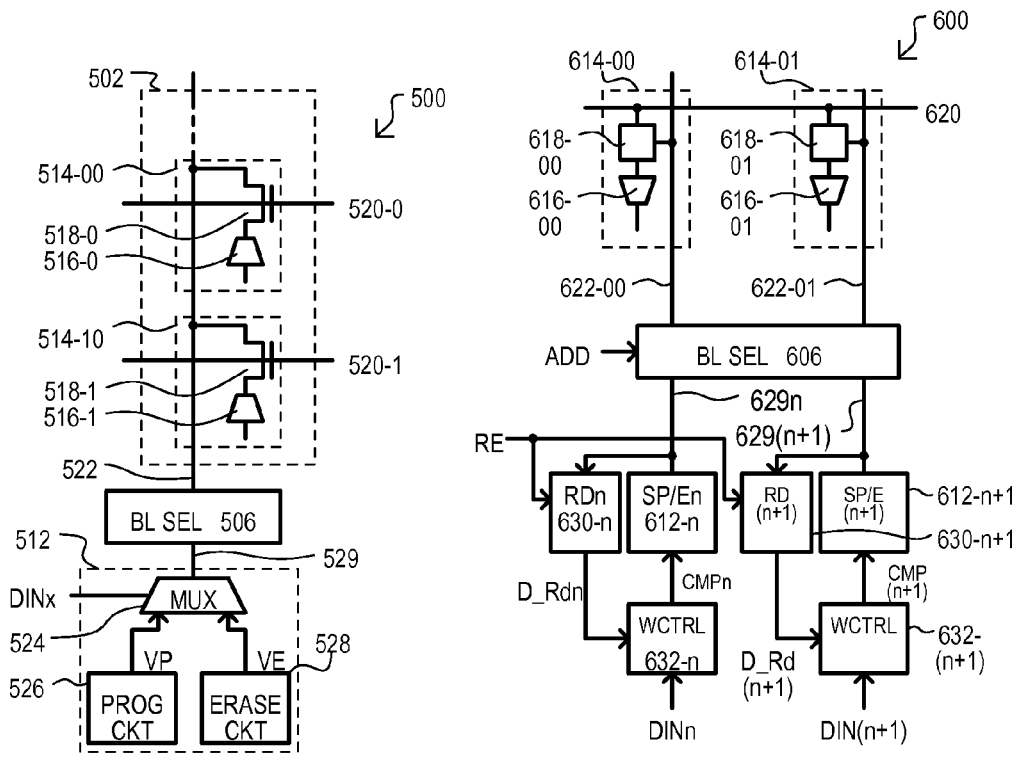
FIG. 5
FIG. 6A

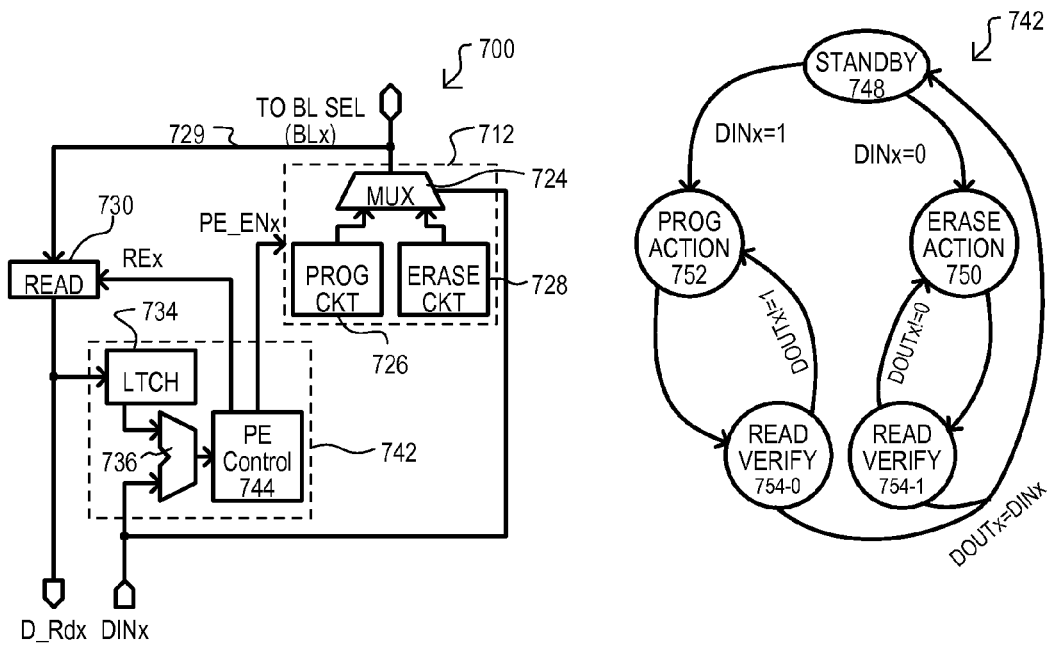
FIG. 7A
FIG. 7B
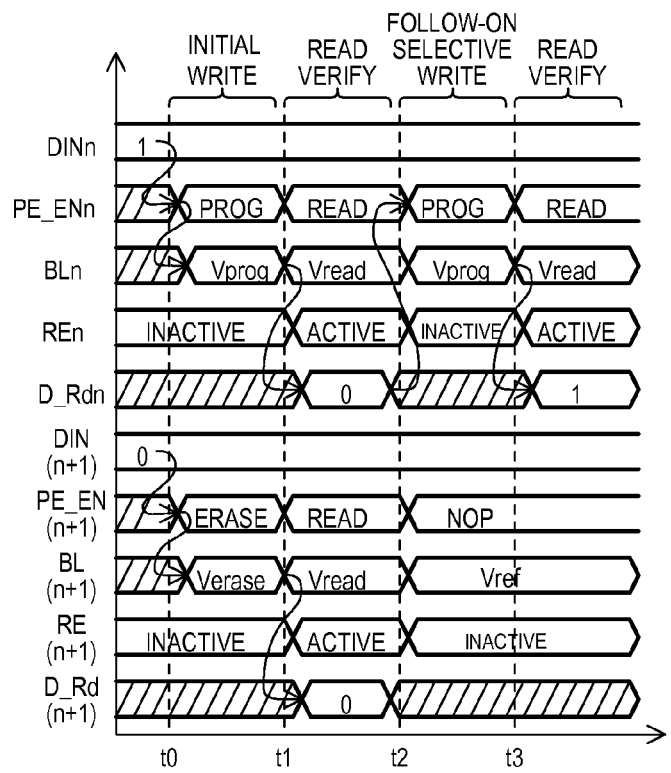
FIG. 7C

FIG. 9B-0 (SELECTED)

FIG. 9B-1 (DE-SELECTED) (Selected Plate, Selected BL, De-selected WL)

FIG. 9B-2 (DE-SELECTED) (Selected Plate, De-elected BL, Selected WL)

FIG. 9B-3 (DE-SELECTED) (Selected Plate, De-elected BL, De-selected WL)

FIG. 9B-4 (DE-SELECTED) (De-selected Plate)

(SELECTED)

(DE-SELECTED)
(De-selected Plate,
Selected BL,
Selected WL)

(DE-SELECTED)
(De-selected Plate,
Selected BL,
De-selected WL)

(DE-SELECTED)
(De-selected Plate,
De-selected BL,
Selected WL)

(DE-SELECTED)
(De-selected Plate,
De-selected BL,
De-selected WL)

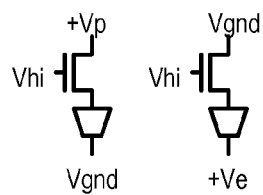
FIG. 14-0
(SELECTED)
(Selected Plate,
Selected BL,
Selected WL)
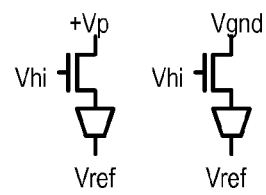
FIG. 14-1
(DE-SELECTED)
(De-selected Plate,
Selected BL,
Selected WL)
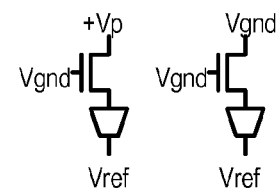
FIG. 14-2
(DE-SELECTED)
(De-selected Plate,
Selected BL,
De-selected WL)
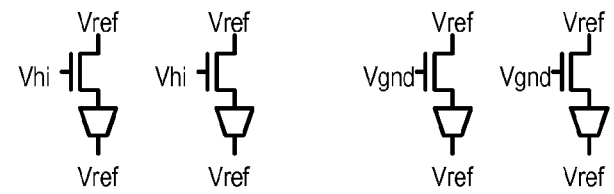
FIG. 14-3
(DE-SELECTED)
(De-selected Plate,
De-selected BL,
Selected WL)
FIG. 14-4
(DE-SELECTED)
(De-selected Plate,
De-selected BL,
De-selected WL)

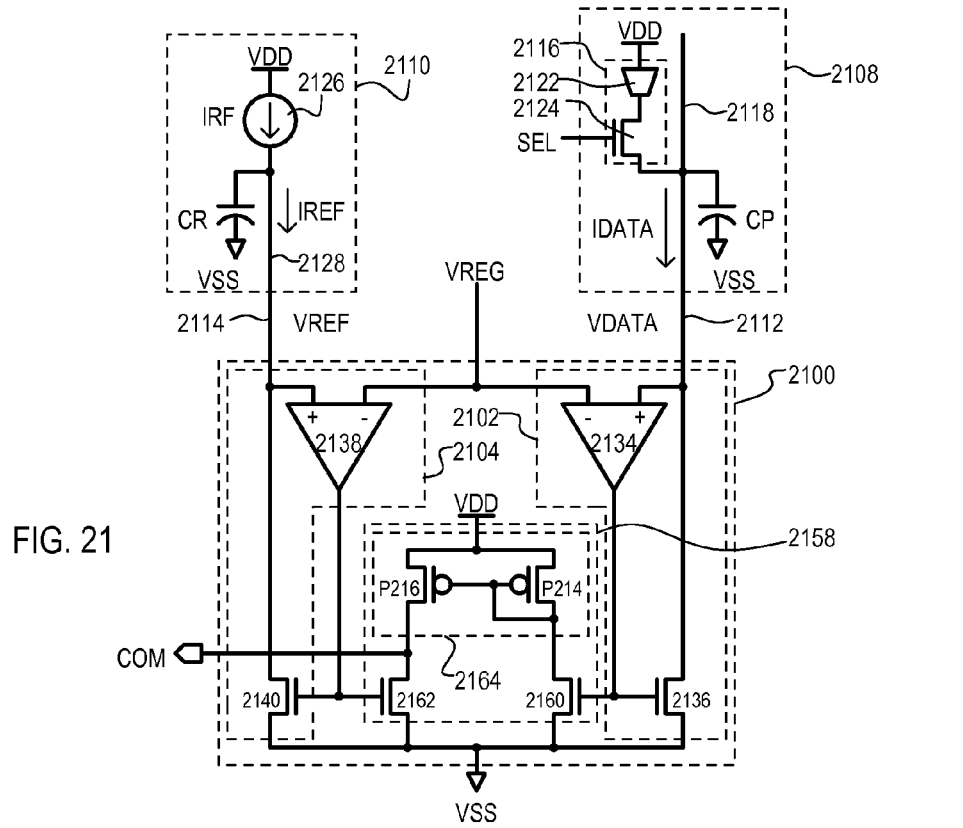
FIG. 21
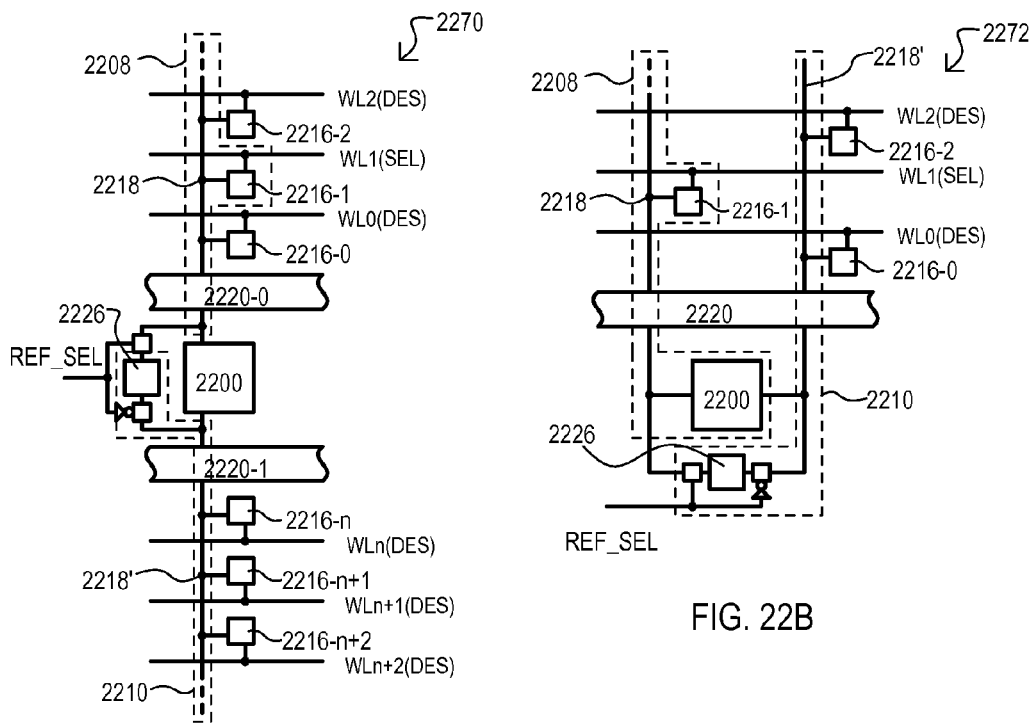
FIG. 22A
FIG. 22B

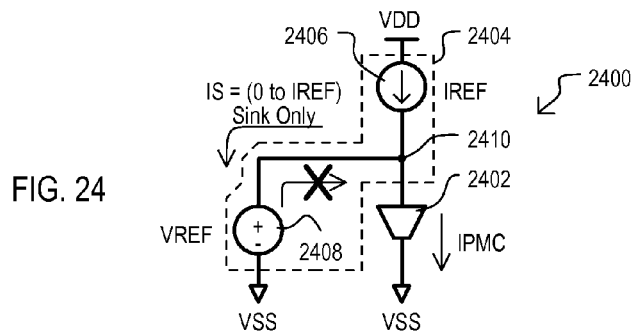
FIG. 24
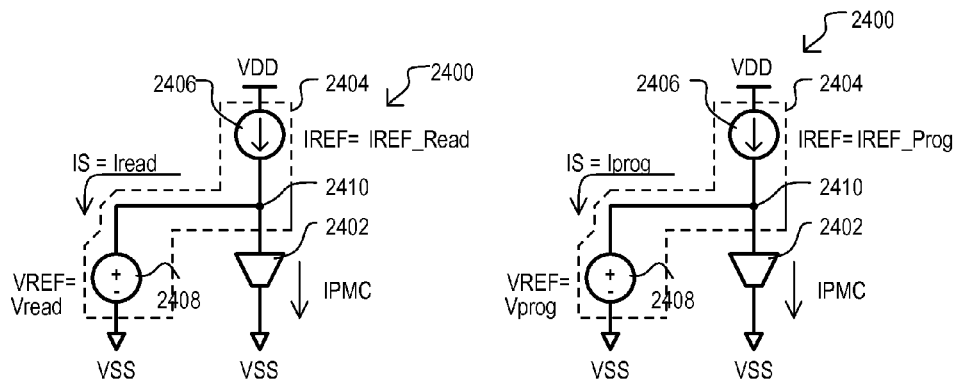
FIG. 25A
FIG. 25B
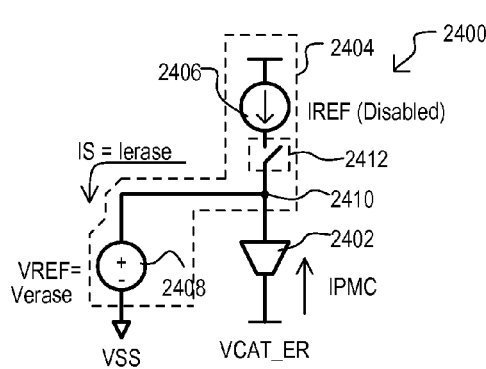
FIG. 25C
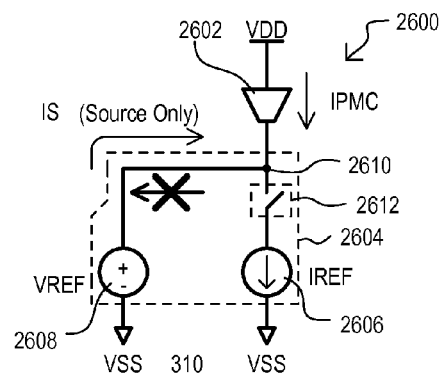
FIG. 26

VARIABLE IMPEDANCE MEMORY DEVICE BIASING CIRCUITS AND METHODS

This application is a continuation of U.S. patent application Ser. No. 12/566,790 filed on Sep. 29, 2009, which claims the benefit of U.S. Provisional Patent Application Ser. No. 61/194,406, filed on Sep. 25, 2008, the contents of which are incorporated by reference herein.

TECHNICAL FIELD

The present invention relates generally to memory devices having variable impedance elements such as programmable metallization cells (PMCs), and more particularly to program and erase circuits for such memory devices.

BRIEF DESCRIPTION OF THE DRAWINGS

FIG. 4A is a block schematic diagram of an integrated circuit device having program and erase according to another embodiment. FIG. 4B is a table showing very particular examples of program and erase voltages for an embodiment like that of FIG. 4A.

FIG. 5 is a block schematic diagram showing program and erase circuits according to an embodiment.

FIG. 6A is a block schematic diagram showing a memory device with selective program and erase circuits according to an embodiment.

FIG. 7A is a block schematic diagram showing a memory device with program and erase, and read verify circuits according to an embodiment. FIG. 7B is a state diagram showing operations of a program/erase control circuit that may be included in FIG. 7A. FIG. 7C is a timing diagram showing particular operations of an embodiment like that of FIG. 7A.

FIGS. 9B-0 to 9B-4 are schematic diagrams showing selection and de-selection of memory cells according to particular embodiments.

FIGS. 12-0 to 12-4 are schematic diagrams showing selection and de-selection of memory cells according to particular embodiments.

FIGS. 14-0 to 14-4 are schematic diagrams showing selection and de-selection of memory cells according to particular embodiments.

FIG. 21 is a block schematic diagram of a read circuit according to still another embodiment.

FIGS. 22A to 22C are top plan views showing circuits according to particular embodiments.

FIG. 24 is a block schematic diagram of a shunt regulation circuit according to an embodiment.

FIGS. 25A to 25C show various operations for the circuit shown in FIG. 24.

FIG. 26 is a block schematic diagram of a shunt regulation circuit according to another embodiment.

DETAILED DESCRIPTION

Various embodiments of the present invention will now be described in detail with reference to a number of drawings. The embodiments show circuits and methods for programming and erasing of different programmable metallization cells (PMCs) of a PMC array. That is, programming one PMC while erasing a different PMC at substantially the same time. Such approaches are in contrast to other nonvolatile memory approaches that typically erase all memory cells of a given region (e.g., sector) in one operation, and then program individual cells of the sector according to write data in a follow-on operation.

Figure 1:
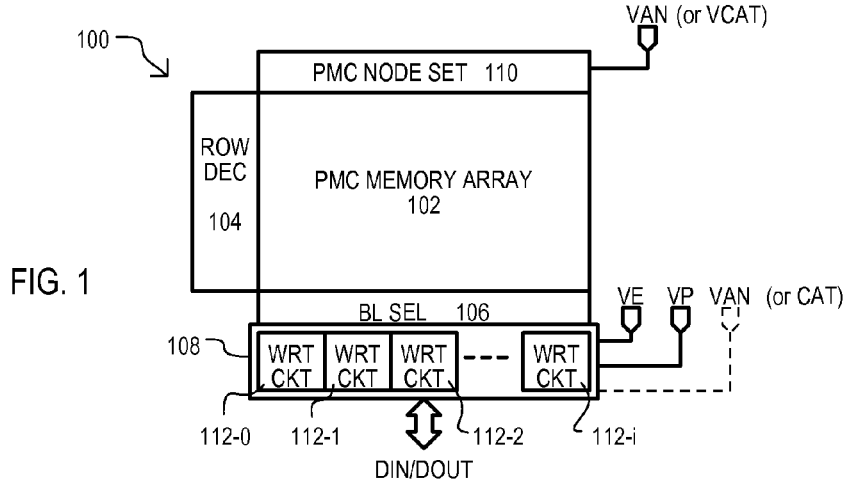
FIG. 1 is a block schematic diagram showing an integrated circuit device having program and erase according to an embodiment.

Referring now to FIG. 1, a memory device according to an embodiment is shown in block schematic diagram and designated by the general reference character 100. A memory device 100 can include a PMC memory array 102, a row decoder 104, a bit line select circuit 106, a program and erase (hereinafter write) circuit 108, and a PMC node set circuit 110.

A PMC array 102 can include a number of memory cells arranged into multiple columns and rows. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material as compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a high resistance state.

In particular arrangements, one electrode of a PMC can be formed of a material including a metal that dissolves in an ion conductor when a sufficient bias is applied across the electrodes (oxidizable electrode) and the other electrode is relatively inert and does not dissolve during operation of the programmable device (an indifferent electrode). For example, one electrode may be an anode during a write process and be comprised of a material including silver that dissolves in an ion conductor and another electrode may be a cathode during the write process and be comprised of an inert material such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Row decoder 104 can activate word lines in response to address data. Bit line select circuit 106 can connect selected bit lines to write circuits 108 in response to selection information.

Write circuits 108 can include a number of program/erase (SP/E) circuits 112-0 to 112-*i*. In response to multiple input write data values DIN, SP/E circuits (112-0 to 112-*i*) can either program or erase corresponding PMC cells within PMC memory array 102. Such programming and/or erasing can occur in parallel to different memory cells at substantially the same time.

Such an approach is in contrast to conventional approaches that can write data in two, discrete phases. In particular, in many conventional approaches such as "flash" electrically erasable and programmable read only memories (EEPROMs), all memory cells are erased to one logic state (e.g., all 1s). In a subsequent, separate program operation, only those bits that have the other logic state (e.g., 0) are programmed. Accordingly, utilizing a simultaneous program/erase approach like those shown herein, and equivalents, can lead to faster write speeds as a single operation can establish both programmed and erased states. Further, such write operations may consume less power as only one operation is performed, as opposed to two operations (i.e., erase all then program some). Still further, in particular embodiments, a bit can be programmed or erased only when it differs from a currently stored value. This may also reduce power consumption, as in such embodiments, it is likely that not all bits will be operated on in the same simultaneous program/erase operation.

PMC node set circuit 110 can establish a potential at one node (e.g., cathode or anode) of a PMC within PMC memory array. The other nodes of such PMCs (anode or cathode) can be driven by a corresponding SP/E circuit (112-0 to 112-*i*). In some embodiments, a PMC node set circuit 110 can maintain nodes of the PMCs at a same potential regardless of whether the corresponding PMCs are being programmed or erased. In other embodiments, a PMC node set circuit 110 may drive nodes of PMCs between two or more voltages based on an address value. That is, such nodes are address decoded. In still other embodiments, a PMC node set circuit 110** may drive nodes of PMCs between two or more voltages based on an address value and an input write data value. That is, such nodes are address and data decoded.

In this way, a PMC memory device can include circuits that can simultaneously program and erase selected PMCs based on data to be written into such PMCs.

Figures 2A, 2B:
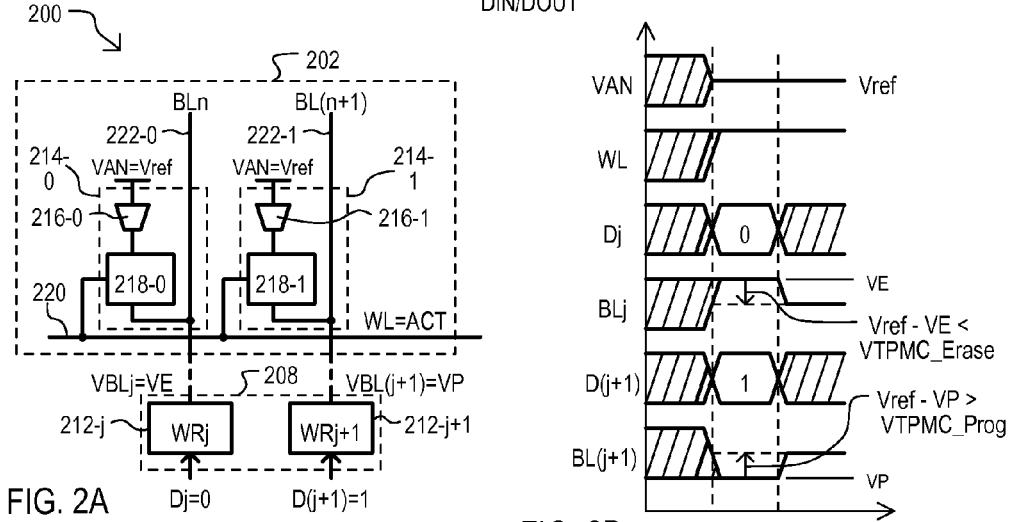
FIG. 2A is a block schematic diagram of an integrated circuit device having program and erase according to a further embodiment.
FIG. 2B is a timing diagram showing particular operations of an embodiment like that of FIG. 2A.

Referring now to FIG. 2A, a PMC memory device according to another embodiment is shown in a block schematic diagram, and designated by the general reference character 200. In one example, device 200 can be one implementation of that shown in FIG. 1. In such an arrangement, like features are referred to with the same reference character but with the first digit being a "2" instead of a "1".

FIG. 2A shows one example of a common anode array, and illustrates an erasing of one memory cell 214-0 and the programming of another memory cell 214-1. In particular embodiments, such an erasing and programming may occur at substantially the same time.

In FIG. 2A, a PMC memory array 202 can include memory cells 214-0 and 214-1, each of which may includes a PMC 216-0/1 and an access device 218-0/1. In response to a word line 220 being driven to an active potential, each access device 218-0/1 can connect its corresponding PMC 216-0/1 to a bit line 222-0/1.

A node setting circuit (not shown in FIG. 2A) can set anodes of PMCs 216-0/1 to a reference voltage Vref. In this particular example, regardless of whether a PMC is being erased or programmed, the anodes of PMCs 216-0/1 can be maintained at the Vref potential.

Write circuit 208 shows two SP/E circuits 212-*j* and 212-(*j*+1). It is understood that such circuits can be connected to bit lines 222-0 and 222-1, respectively, by intervening bit line selection circuits (not shown). In some embodiments, each SP/E circuit (212-*j*/(*j*+1)) may provide program and erase voltages for any of multiple bit lines selected by a bit line selection circuit.

FIG. 2A shows one particular simultaneous program/erase operation in which, in response to an input data value Dj=0, PMC 216-0 is being erased to a relatively high impedance, and in response to input data value D(j+1)=1, PMC 216-1 is being programmed to a relatively low impedance. A word line 220 can be driven to an activation potential, enabling (e.g., placing into a low impedance and/or current conducting state) access devices 218-0/1. As a result, write circuit 212-*j* can apply an erase voltage to bit line 222-0 (VBj=VE), while at the same time write circuit 212-(*j*+1) can apply a program voltage to bit line 222-1 (VBL(j+1)=VP). In such an arrangement, a cathode of PMC 216-0 can be driven to about VE, while its anode is maintained at Vref. In contrast, a cathode of PMC 216-1 can be driven to about VP, while its anode is maintained at Vref. The following is assumed to be true in this configuration:

$VE > Vref > VP,$ $Vref - VP > Vt_{PMC\_}Prog,$ and $Vref - VE < Vt_{PMC\_}Erase.$ where $Vt_{PMC\_}Prog$ is a positive program threshold voltage for the PMCs, and $Vt_{PMC\_}Erase$ is a negative erase threshold voltage for the PMCs (polarity being measured from anode to cathode).

Referring to FIG. 2B, a timing diagram shows one example of the above described write operation of FIG. 2A. At about time t0, in response to input write data values Dj/D(j+1), corresponding bit lines BLj/BL(j+1) may be driven to an erase voltage (VE) or program voltage (VP). In this particular embodiment, a common anode voltage (VAN) may remain substantially constant at Vref.

In this way, a PMC memory device having a common anode configuration can simultaneously erase and program different memory cells in a same operation, while maintaining such common anodes at a substantially constant voltage.

Figures 3A, 3B:
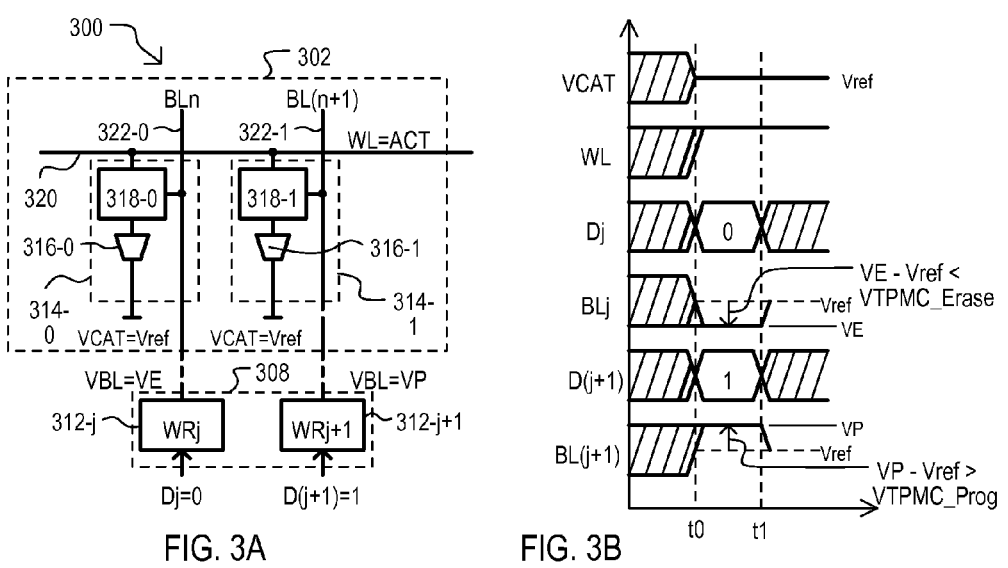
FIG. 3A is a block schematic diagram of an integrated circuit device having program and erase according to another embodiment.
FIG. 3B is a timing diagram showing particular operations of an embodiment like that of FIG. 3A.

Referring now to FIG. 3A, a PMC memory device according to another embodiment is shown in a block schematic diagram, and designated by the general reference character 300. In one example, device 300 can be one implementation of that shown in FIG. 1. FIG. 3A can include some of the same general features as FIG. 2A, thus like features are referred to with the same reference character but with the first digit being a "3" instead of a FIG. 3A shows one example of a common cathode array. In such arrangement, common cathodes of PMCs 316-0/1 can be maintained at a reference voltage Vref, regardless of whether the PMC is being programmed or erased. In addition, the simultaneous application of program and erase voltage can meet the following conditions:

$VP > Vref > VE,$ $VP - Vref > Vt_{PMC\_}Prog,$ and $VE - Vref < Vt_{PMC\_}Erase.$ Referring to FIG. 3B, a timing diagram shows the above described write operation of FIG. 3A. At about time t0, in response to input write data values Dj/D(j+1), corresponding bit lines BLj/BL(j+1) may be driven to an erase voltage (VE) or program voltage (VP). In this particular embodiment, a common cathode voltage (VCAT) may remain substantially constant at Vref.

In this way, a PMC memory device having a common cathode configuration can simultaneously erase and program different memory cells in a same operation, while maintaining such common cathodes at a substantially constant voltage.

Referring to FIGS. 4A and 4B, one very particular example of a memory device having a common anode configuration is shown. In the example shown, device 400 can be one implementation of that shown in FIG. 2A, thus like features are referred to with the same reference character but with the first digit being a "4" instead of a "2". In FIG. 4A, access devices 418-0/1 are particularly shown to be n-channel insulated gate field effect (e.g., MOS) transistors.

FIG. 4B is a table showing examples of possible voltages for the simultaneous erase and program operations. That is, FIG. 4B shows an arrangement in which VE=+3.0 volts, Vref=+1.5 volts, and VP=0 volts.

Referring now to FIG. 5, a PMC memory device according to yet another embodiment is shown in a block schematic diagram, and designated by the general reference character 500. In one example, device 500 can be one implementation of that shown in FIGS. 1, 2A, 3A and 4A. FIG. 5 can include some of the same general features as FIG. 1, thus like features are referred to with the same reference character but with the first digit being a "5" instead of a "1".

FIG. 5 shows a portion of a column within PMC memory array 502 that includes two memory cells 514-00 and 514-10 having n-channel MOS (NMOS) transistors connecting PMCs 516-0/1 to a same bit line 522. Bit line 522 can be connected to SP/E circuit 512 by bit line selection circuit 506.

In the particular example of FIG. 5, a SP/E circuit 512 can include a selection circuit 524 (shown as a multiplexer (MUX), in this particular example), a program circuit 526, and an erase circuit 528. A program circuit 526 can provide a suitable voltage for application to one electrode of a PMC (i.e., anode or cathode) with respect to the other electrode (i.e., cathode or anode). In the particular example of FIG. 5, a program circuit 526 can provide a program voltage suitable for application to a cathode of a PMC with respect to an anode voltage (preferably a common anode voltage). Similarly, an erase circuit 528 can provide an erase program voltage suitable for application to an anode of a PMC with respect to a cathode voltage (preferably a common anode voltage).

In response to input write data DINx, selection circuit 524 can connect either program circuit 526 or erase circuit 528 to an access path 529. Access path 529 can be connected to bit line 522 via bit line selector circuit 506. It is understood that in response to some other address, access path 529 could be connected to some other bit line (not shown the figure). Thus, if an input data value DINx has one value (e.g., 0), selection circuit 524 connects erase circuit 528 to drive bit line 522, resulting in the bit line being driven to an erase voltage (VE). In contrast, if an input data value DINx has another value (e.g., 1), selection circuit 524 connects program circuit 526 to drive bit line 522, resulting in the bit line being driven to a program voltage (VP). It is understood that an SP/E circuit 512 can be repeated in parallel, to enable simultaneous erase or programming of multiple bits in parallel.

In this way, a simultaneous program and erase circuit can include a selection circuit that selectively connects either an erase circuit or a program circuit to a bit line based on an input data value.

Referring now to FIG. 6A, a PMC memory device according to yet another embodiment is shown in a block schematic diagram, and designated by the general reference character 600. In one example, device 600 can be one implementation of those shown in the previous figures, thus like features are referred to with the same reference character but with the first digit being a "6".

FIG. 6 can differ from the other embodiments in that a program or erase operation can be conditioned on a value already stored by an accessed PMC. That is, if a data value corresponding to an erased state (e.g., 0) is to be written to a PMC that is already erased, no operation is executed. Likewise, if a data value corresponding to a programmed state (e.g., 1) is to be written to a PMC that is already programmed, no operation is executed.

Referring to FIG. 6A, a memory device 600 can include access paths 629-n/(n+1) that may be connected to bit lines 622-00/01 by a bit line select circuit 606. Memory cells 614-00/01 may be connected to bit lines 622-00/01, and may each include an access device 618-00/01 and a PMC 616-00/01. Access devices 618-00/01 may connect one electrode (e.g., anode or cathode) of a corresponding PMC to a bit line. In the very particular embodiment shown, access devices 618-00/01 connect anodes of PMCs 616-00/01 to bit lines 622-00/01.

Connected to each access path 629-n/(n+1) may be an SP/E circuit 612-n/(n+1), a read circuit 630-n/(n+1), and a selective write circuit 632-n/(n+1). SP/E circuits 612-n/(n+1) may include features of SP/E circuits shown in other embodiments, or equivalents. However, SP/E circuits 612-n/(n+1) may also be capable of being disabled, or otherwise prevented from driving a corresponding access path or bit line with a program or erase voltage. That is, in response to an input value (in this case CMPn/(n+1)), SP/E circuits 612-n/(n+1) may be prevented from applying an erase or program voltage to a PMC.

Read circuits 630-n/(n+1) can read data from PMC memory cells 614-00/01 selected by a word line (e.g., 620) and bit line select circuit 606. Such read data may be output as values D_Rdn/(n+1) in FIG. 6A. Read circuits 630-n/(n+1) may be enabled by a read enable signal RE.

Selective write circuits 632-00/01 can selectively disable a program or erase operation for an accessed memory cell based on the data stored in such a memory cell. In the example of FIG. 6A, each selective write circuit 632-00/01 may receive a read data value D_Rdn/(n+1), as well as a corresponding input write data value DINn/(n+1). Each selective write circuit 632-00/01 may generate an output value CMPn/(n+1) based on a comparison between read data values D_Rdn/(n+1) and corresponding write data values DINn/(n+1).

Figure 6B:
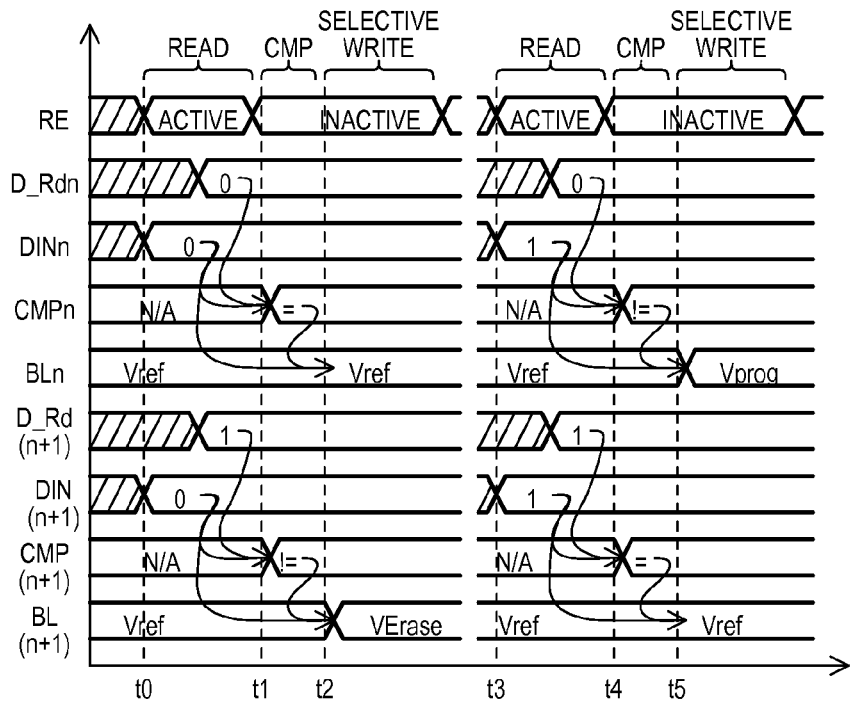
FIG. 6B is a timing diagram showing particular operations of an embodiment like that of FIG. 6A.

Referring now to FIG. 6B, one particular selective simultaneous program/erase operation for an embodiment like that of FIG. 6A will be described in a timing diagram. FIG. 6B includes waveforms for various signals noted in the description of FIG. 6A.

At about time t0, signal RE may go to an active state to start read operations on accessed memory cells. At this initial part of a read operation, read data values D_Rdn/(n+1) may not yet be considered valid. Similarly, write control outputs CMPn/(n+1) may not yet be considered valid. Bit line (BLn/(n+1)) may be at a non-program or erase potential, which in this particular example is Vref. It is understood that in some embodiments, a voltage Vref may be an erase or program voltage depending upon a voltage applied to an opposing electrode of a PMC.

After time t0, read data may be determined and output from read circuits. In the very particular example shown read data values are: D_Rdn=0 and D_Rd(n+1)=1.

At about time t1, signal RE may return to an inactive state, ending a read operation. Selective write circuits may then compare read data to input write data. In the very particular example shown, write data values are DINn=0 and DIN(n+1)=0. It is noted that write data values (DINn/(n+1) may be received prior to at time t1. In the case of CMPn, a read data value may be the same as a corresponding write data value, resulting in an equal (=) result. In contrast, in the case of CMP(n+1), a read data value may differ from the same as write data value, resulting in a not equal (!=) result.

At about time t2, a selective write operation may take place. Because value CMPn is "equal" (=), a write operation to bit line BLn may be disabled, and BLn may remain at Vref. However, because value CMP(n+1) is not equal (and an input write data value is 0), an erase voltage (VErase) may be applied on bit line BL(n+1).

At times t3 to t5, FIG. 6B shows a similar operation to that shown at times t0 to t2. However, at times t3 to t5 read data D_Rdn differs from corresponding write data DINn, while read data D_Rd(n+1) is the same as corresponding write data DIN(n+1). As a result, at time t5 bit line BL(n+1) may remain at Vref, while bit line BLn may be driven to a program voltage (Vprog).

In this way, a PMC memory device can selectively program or erase accessed PMC memory cells when the data stored by such memory cells differs from received write data. Such an arrangement can reduce power consumption as only a read operation is performed (i.e., no write or program operation takes place for the accessed memory cell) when a read data value matches a write data value.

Figure 6C:
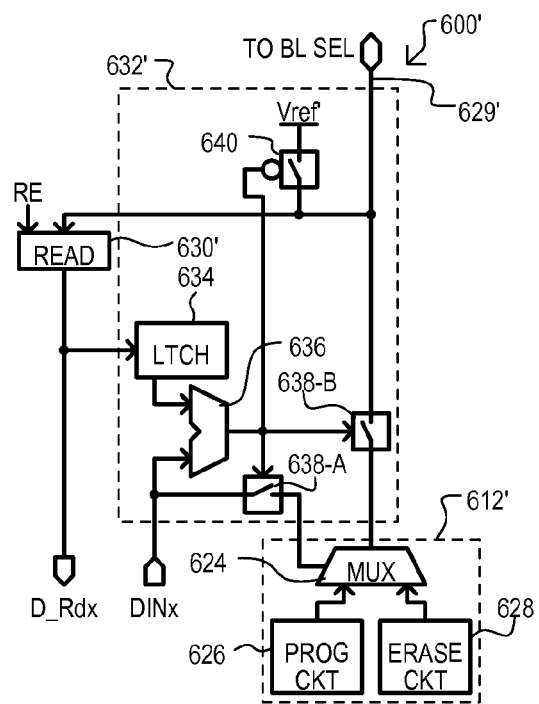
FIG. 6C is a block schematic diagram showing another memory device with selective program and erase circuits according to an embodiment.

Referring to FIG. 6C, a memory device according to another embodiment is shown in block schematic diagram and designated by the general reference character 600'. Memory device 600' may include features like those of FIG. 6A, and in one arrangement, may be one version of that shown in FIG. 6A.

A memory device 600' may include an SP/E circuit 612', a read circuit 630', and a selective write circuit 632'. An SP/E circuit 612' can have the form of any of those shown in other embodiments, or equivalents. However, in the particular example shown, SP/E circuit 612' can have the same structure as that shown as 512 in FIGS. 4-5.

A read circuit 630' can read data from a selected PMC memory cell (not shown). In the example of FIG. 6C, such data can be provided as output data D_Rdx.

It is understood that access path 629' can be connected to one or more PMC cells of a memory array with access circuits, such as bit line selection circuits, as but one example.

A selective write circuit 632' can selectively program or erase an accessed memory cell (not shown) based on the data stored in such a memory cell. In the example of FIG. 6C, selective write circuit 632' can include a read data store 634, a comparator 636, disable switches 638-A/B, and bias switch 640. Read data store 634 can store data output by read circuit 630 by a read operation. A comparator 636 can compare data stored by read data store 634 to data received as input write data (DINx). In response to an output of comparator 636, disable switches (638-A/B) and bias switch 640 can be enabled or disabled. Disable switch 638-A can enable or disable the transmission of an input data value DINx to selection circuit 624. Disable switch 638-B can enable or disable a path between SP/E 612 and access path 629. Bias switch 640 can disable or enable a connection between access path 629 and a disable voltage Vref. Such a disable voltage can be chosen to place a same voltage across both terminals of a PMC if an erase or program operation is inhibited due to the write data matching the data already stored by the PMC.

It is understood that an arrangement like that shown in FIG. 6C can be repeated in parallel multiple times.

Having described the various sections of memory device 600', the operation of such a device will now be described.

Prior to a write operation, a read operation can be performed. A read operation can access a particular PMC cell, resulting in read data being captured within read data store 634. It is noted that a read operation is typically performed at much lower voltages than a program or erase operation. In addition, a read operation can be faster than a program or erase operation.

A write operation can then be selectively performed. Input data (DINx) can be received prior or after the read operation. Comparator 636 can compare a data value within read data store 634 to input data value DINx. If such data values indicate different data states (e.g., the memory cell is programmed but the input data indicates an erase operation, or vice versa), then the indicated operation (program or erase) can take place. Disable switches 638-A and 638-B can be enabled (provide a low impedance), while bias switch 640 can be disabled (provide a high impedance). This can allow SP/E circuit 612' to apply either a program or erase voltage to access path 629' based on an input data value DINx.

However, if comparator 636 indicates that a stored read data value is the same as input data value DINx, then no erase or program operation can take place. Disable switches 638-A and 638-B can be disabled, preventing SP/E circuit 612 from applying either a program or an erase voltage. At the same time, bias switch 640 can be enabled, causing access path 629' to be driven to a voltage Vref. In one particular example, a voltage Vref can be a voltage commonly applied to the electrode opposite to that accessed with access path 629'. Consequently, when a stored data value in a PMC matches that of an incoming write data value, a write operation applies a same voltage to both electrodes of the PMC, maintaining the PMC in its current state.

In this way, a PMC memory device can selectively program or erase accessed PMC memory cells based on a comparator result between read data and write data.

Referring now to FIGS. 7A to 7C, a PMC memory device according to still another embodiment is shown in a block schematic diagram, and designated by the general reference character 700. In one example, a memory device 700 can be one implementation of those shown in the previous figures, thus like features are referred to with the same reference character but with the first digit being a "7".

FIGS. 7A to 7C show arrangements in which program and/or erase operations can be executed in an iterative fashion (i.e., application of multiple pulses and/or different voltages). Following each such erase/program action, a read verify operation can be executed. If such a read verify operation indicates the accessed PMC data does not match the desired value, the program or erase action can be repeated.

Referring to FIG. 7A, a memory device 700 can include an SP/E circuit 712, a read circuit 730, and a read verify circuit 742. An SP/E circuit 712 can have the form of any of those shown in other embodiments, or equivalents. In the particular example of FIG. 7A, SP/E circuit 712 can have the same structure as that shown as 512 in FIG. 5.

Like the arrangement of FIGS. 6A and 6C, a read circuit 730 can read data from a selected PMC memory cell.

A read verify circuit 742 can verify whether an accessed PMC memory cell has achieved a desired state, and then enables SP/E circuit 712 to execute a follow on operation in the event the state has not yet been reached. In the example of FIG. 7A, read verify circuit 742 can include a read data store 734, a comparator 736, and P/E control logic 744. One example of the execution of P/E control logic 744 is shown in FIG. 7B.

FIG. 7B is state diagram 746 showing an example of the operation of P/E control logic 744. Starting at a standby state 748, if an input data value DINx has one value (in this case 0), an erase action 750 can be executed. Such an action can include, as but one example, applying an erase potential across electrodes of a selected PMC one or more times. If an input data value DINx has another value (in this case 1), a program action 752 can be executed. Such an action can include, as but one example, applying a program potential across electrodes of a selected PMC one or more times. Following the erase or program action (750 or 752), a read verify operations 754-0/1 can be performed. Such a step can include accessing the same PMC that was programmed or erased, and determining its data value based on its impedance. If the read data value indicates a mismatch with the input data value, the program or erase action can be repeated. If, however, the read data indicates a match with an input data value, the circuit can return to state 748.

Referring to FIG. 7C, one particular read verify and selective simultaneous program/erase operation for an embodiment like that of FIG. 7A will be described with reference to a timing diagram. FIG. 7C includes waveforms for two different circuits like that of FIG. 7A.

Prior to or at about time t0, write input data values DINn=1 and DIN(n+1)=0 may be received. At this time, read circuits may be disabled by signal REn and RE(n+1) being inactive.

At about time t0, in response to write data value DINn=1, P/E control logic may initiate a program operation that causes bit line BLn to be driven to a program voltage Vprog. On the other hand, in response to write data value DIN(n+1)=0, P/E control logic may initiate an erase operation that causes bit line BL(n+1) to driven to an erase voltage Verase. As noted above, program and erase voltages (Vprog/Verase) may be applied as single voltage pulses, or multiple voltage pulses, including pulses of varying amplitude and/or duration.

At about time t1, P/E control circuits may initiate read verify operations by activating read enable signals REn/(n+1). This may result in read data values being read from those locations written to at time t0. In the embodiment shown, read data value D_Rdn, corresponding to write data value DINn may be 0, indicating that a program operation is not complete. In contrast, read data value D_Rd(n+1), corresponding to write data value DIN(n+1) may be 1, indicating that an erase operation is complete.

At about time t2, a P/E control circuit corresponding to bit line BLn may execute a follow-on program operation, like that occurring at time t0. However, in some embodiments, a resulting bit line program voltage Vprog may be different from that applied at time t0. In contrast, because an erase operation on bit line BL(n+1) was considered complete, the corresponding P/E control circuit may take no action (NOP). In the very particular example of FIG. 7C, such a no action operation may result in bit line BL(n+1) being set to a voltage Vref.

At about time t3, P/E control circuit for bit line BLn may initiate another read verify operation. In the embodiment shown, read data value D_Rdn may now be read as "1", indicating that a program operation is complete. In contrast, P/E circuit for bit line BL(n+1) may continue to take no action.

In this way, a PMC memory device can verify a given erase or program operation action on a bit-wise basis to determine if such an operation should be repeated. Such an arrangement can provide an advantageously efficient way of simultaneously programming and erasing multiple locations as programming and erase actions are executed only as needed to achieve a desired impedance state across the selected PMC devices. In addition, such a feature can help to avoid over-erasure and/or over-programming of a PMC.

Figure 8:
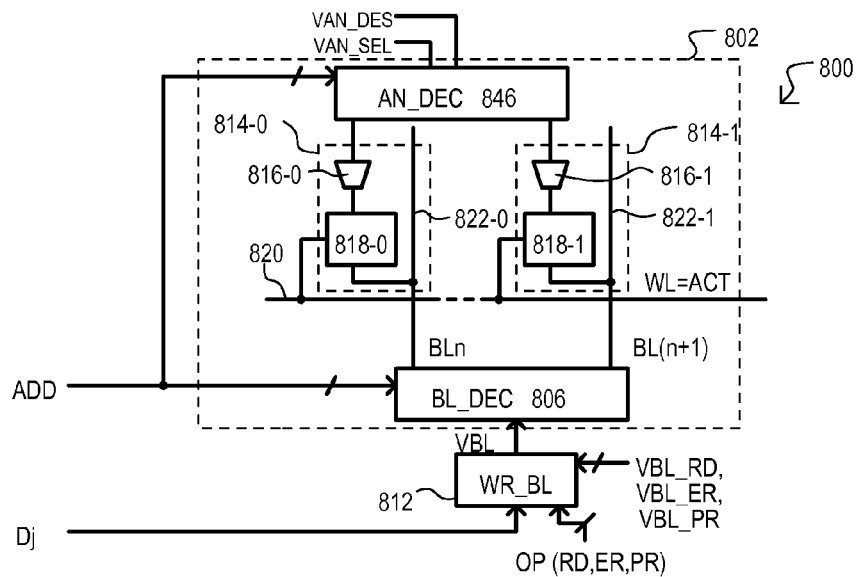
FIG. 8 is a block schematic diagram showing a memory device with program and erase circuits, and address decoded anodes according to an embodiment.

Referring to FIG. 8, a PMC memory device according to another embodiment is shown in a block schematic diagram, and designated by the general reference character 800. In one example, device 800 can be one implementation of that shown in FIG. 1. FIG. 8 can include some of the same general features as FIG. 2A, thus like features are referred to with the same reference character but with the first digit being an "8" instead of a "2".

FIG. 8 shows one example of an arrangement in which voltages applied to first terminals of a PMC (i.e., anode and cathode) can be selected based on the operation type (i.e., read, program, erase), input data value (in the case of a program or erase operation), as well as an address value. At the same time, a voltage applied to second terminals of PMC may be based on address values. Accordingly, the example of FIG. 8 shows an arrangement having an "address decoded" anode arrangement.

In the example of FIG. 8A, an SP/E circuit 812 can apply a bit line voltage VBL to a selected bit line (822-0 or 822-1) by way of a bit line decoding circuit 806. A bit line voltage VBL can vary according to operation and input data Dj, as described in above embodiments. Such a voltage can be applied to a bit line through bit line decoding circuit 806 according to an address value ADD. In the same general fashion as FIG. 2A, such a bit line voltage (VBL) can be applied to a cathode of a selected PMC (814-0 or 814-1) by operation of an access device (818-0 or 818-1). SP/E circuit 812 can determine if an operation is a read or a program/erase operation based on an operation value OP. Based on such a determination, in a read operation, SP/E circuit 812 can apply a read voltage VBL_RD to a selected bit line. In a program/erase operation, SP/E circuit 812 can apply either an erase voltage VBL_ER or a program voltage VBL_PR based on an input data value Dj.

The example of FIG. 8 further includes an anode decoding circuit 846. An anode decoding circuit 846 may vary a voltage applied to anodes according to an address value ADD. In the particular embodiment shown, anode decoding circuit 846 may apply a select voltage VAN_SEL or VAN_DES based on a received address value.

In this way, a PMC memory device can apply a voltage to a PMC electrode opposite to that accessed by a bit line, to apply a voltage that can vary according to an input address.

Figure 9A:
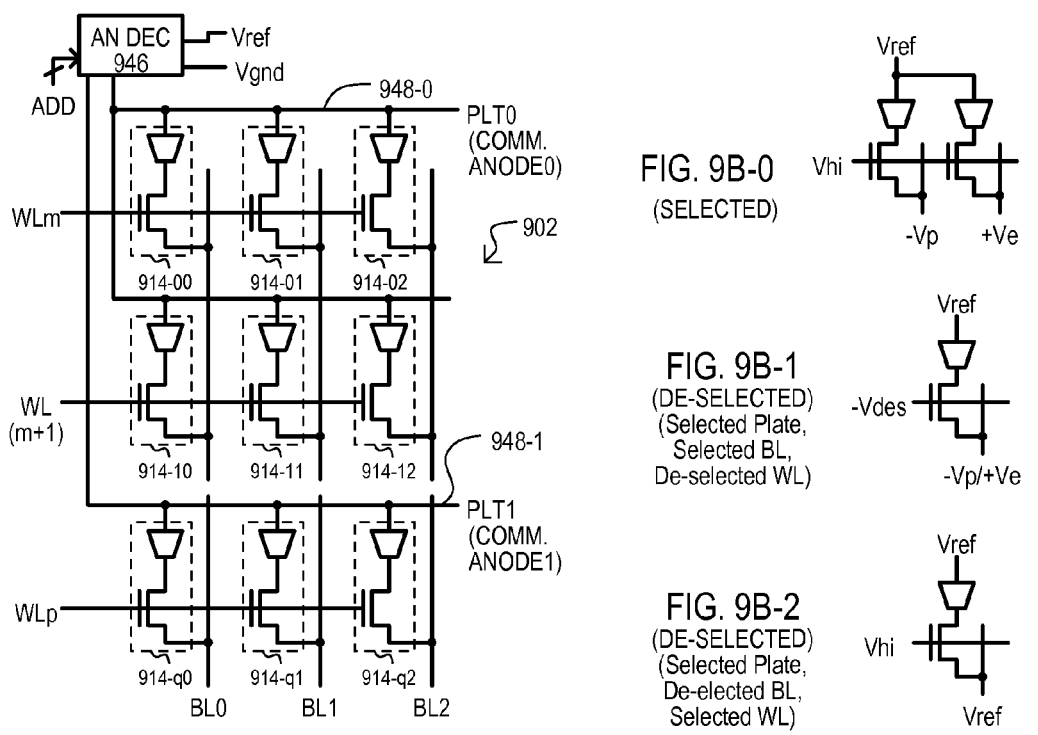
FIG. 9A is a block schematic diagram showing a PMC array that may be included in embodiments of the invention.

Referring to FIG. 9A, one example of a PMC array 902 that may be included in an embodiment like that of FIG. 8 is shown in a block schematic diagram. PMC array 902 may include a number of memory cells 914-00 to 914-q2. In one embodiment, a memory cell may be selected for a program or erase operation by driving its plate to a particular voltage (i.e., selecting its plate), driving its word line to a particular voltage (i.e., selecting its word line), and driving its bit line to a program or erase voltage.

FIG. 9 shows memory cells 914-00 to 914-12 with anodes commonly connected to one another at a plate 948-0. Similarly, memory cells 914-q0 to 914-q2 have anodes commonly connected at a different plate 948-1.

Anode decode circuit 946 may drive plates 948-0/1 between two voltages according to address data ADD. In a particular embodiment, when a program or erase operation is occurring to a memory cell, anode decode circuit 946 may drive the corresponding plate 948-0/1 (and hence its anode) to a select voltage. Conversely, when no memory cell for a plate 948-0/1 is accessed, the corresponding plate may be driven to a de-select voltage. In the very particular example shown, a select voltage may be Vref and a de-select voltage may be Vgnd.

Figures 0, 12:
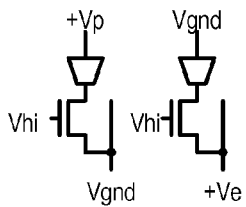
Figures 1, 12:
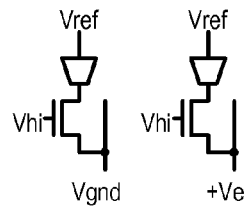
Figures 2, 12:
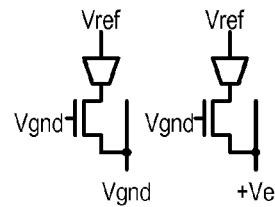
Figures 3, 12:
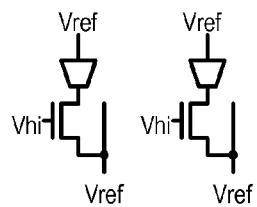
Figures 4, 12:
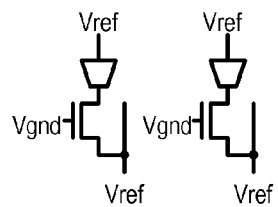

Referring now to FIGS. 9B-0 to 9B-4, examples of voltages that may be applied to PMC memory cells for a PMC array like that of FIG. 9A, are shown in schematic diagrams.

FIG. 9B-0 shows memory cells selected for program and erase operations. A word line is selected by being driven to Vhi, one bit line receives a program voltage −Vp and the other receives an erase voltage +Ve. Anodes of PMCs are connected to Vref (i.e., their common node, or plate is driven to Vref). It is understood that a difference between Vref and −Vp is sufficient to program a PMC, and a difference between Vref and +Ve is sufficient to erase a PMC.

FIGS. 9B-1 shows a memory cell de-selected with a word line voltage. A voltage (−Vdes) applied to word line is sufficient to prevent a sufficient erase or program voltage from developing across a PMC.

FIGS. 9B-2 shows a memory cell de-selected with a bit line voltage. Voltage Vref may be applied to a bit line, which is the same as that applied to the anode, resulting in no differential voltage across the PMC.

FIGS. 9B-3 shows both bit line and word line de-selection.

FIGS. 9B-4 shows a memory cell connected to a de-selected plate. In the example shown, an anode (i.e., plate), word line and corresponding bit line are all maintained at Vgnd.

In this way, commonly connected anodes may be decoded and de-selected from program and/or erase operations.

Figure 10:
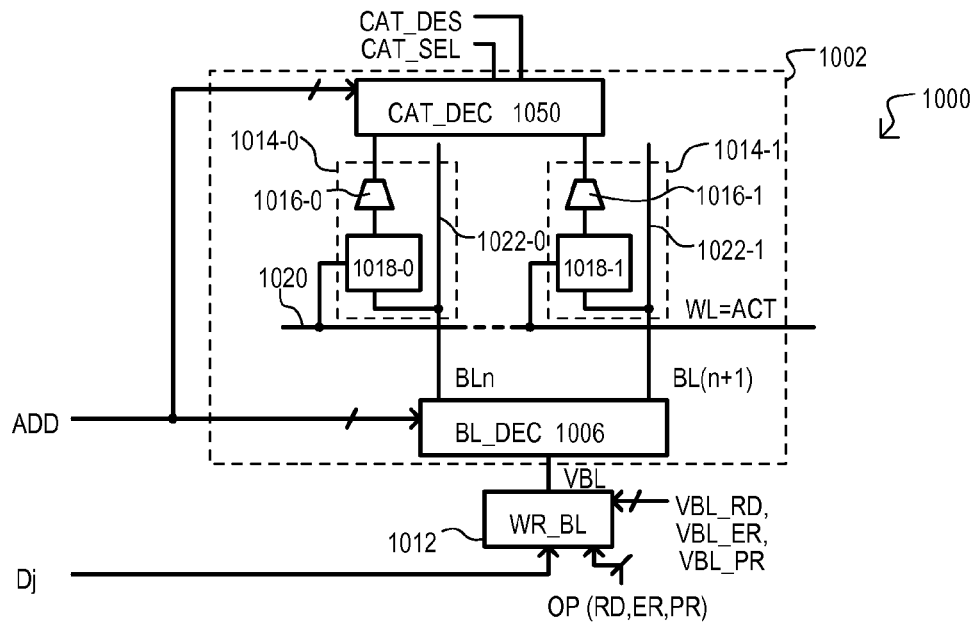
FIG. 10 is a block schematic diagram showing a memory device with program and erase circuits, and decoded cathodes according to an embodiment.

Referring to FIG. 10, a PMC memory device according to still another embodiment is shown in a block schematic diagram, and designated by the general reference character 1000. In one example, device 1000 can be one implementation of that shown in FIG. 1. FIG. 10 can include some of the same general features as FIG. 8, thus like features are referred to by the same reference character but with the first leading digits being "10" instead of "8".

FIG. 10 differs from FIG. 8 in that a PMC memory array 1002 can have a decoded cathode arrangement. Thus, various mode/data related bit line voltages (VBL_RD, VBL_ER, VBL_PR) can be applied to anodes of PMCs (1016-0/1) via bit lines (1022-0/1) and access devices (1018-0/1). At the same time, cathode decode circuit 1050 may apply either a select voltage VCAT_SEL or a de-select voltage VCAT_DES to PMC cathodes. Cathodes may be connected to common nodes (e.g., plates) in a manner like anode connections shown in FIG. 9A.

In this way, commonly connected cathodes may be decoded and de-selected from program and/or erase operations.

Figure 11:
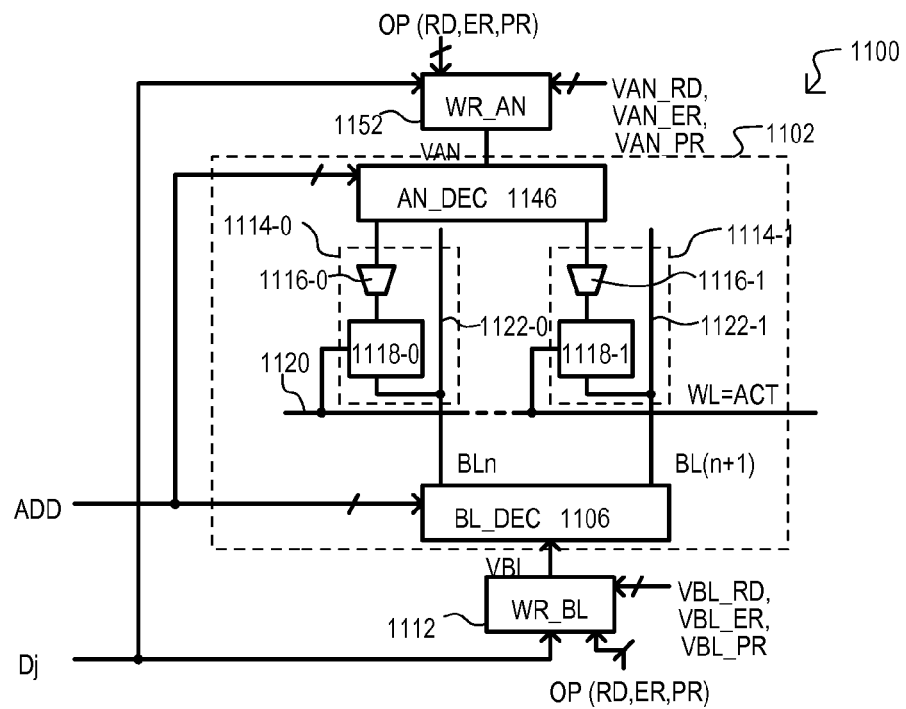
FIG. 11 is a block schematic diagram showing a memory device with program and erase circuits, and data decoded anodes according to an embodiment.

Referring to FIG. 11, a PMC memory device according to another embodiment is shown in a block schematic diagram, and designated by the general reference character 1100. In one example, device 1100 can be one implementation of that shown in FIG. 1. FIG. 11 can include some of the same general features as FIG. 8, thus like features are referred to with the same reference character but with the leading digits being "11" instead of an "8".

FIG. 11 shows one example of an arrangement in which voltages applied to both terminals of a PMC (i.e., anode and cathode) can be selected based on the operation type (i.e., read, program, erase) as well as the input data value (in the case of a program or erase operation). Thus, example of FIG. 11 can be conceptualized as having a "data decoded" anode arrangement.

The embodiment of FIG. 11 can differ from that of FIG. 8 in that it may include an anode voltage circuit 1152 that may provide a predetermined anode voltage VAN to a selected anode by way of an anode decoding circuit 1146. An anode voltage VAN can vary according to operation and input data Dj. Anode voltage circuit 1152 can determine if an operation is a read or a program/erase operation based on an operation value OP. Thus, in a read operation, anode voltage circuit 1152 can apply an anode read voltage VAN_RD to a selected anode. In a program/erase operation, anode voltage circuit 1152 can apply either an anode erase voltage VAN_ER or an anode program voltage VAN_PR based on an input data value Dj.

It is understood that while FIG. 11 shows bit line voltages that can vary between operations, in alternate embodiments bit line voltages can be maintained at one voltage, with voltages applied to a decoded anode may vary according to operation and input data value.

Referring now to FIGS. 12-0 to 12-4, examples of voltages that may be applied to PMC memory cells for a PMC array like that of FIG. 10 are shown in schematic diagrams. FIGS. 12-0 to 12-4 show arrangements in which a memory cell access device is an n-channel transistor.

FIG. 12-0 shows memory cells selected for program and erase operations. A word line is selected by being driven to Vhi. In the case of a programmed cell, a bit line may be driven to a voltage Vgnd, while a corresponding anode may be driven to a program voltage +Vp. In the case of an erased cell, a bit line may be driven to an erase voltage +Ve, while a corresponding anode may be driven to a voltage Vgnd. It is understood that a difference between +Vp and Vgnd is sufficient to program a PMC, and a difference between Vgnd and +Ve is sufficient to erase a PMC.

FIG. 12-1 shows a how a memory cell may be de-selected (i.e., prevented from being erased or programmed), even if corresponding bit lines are being driven for program/erase operations, and the word line is active (Vhi). As shown in FIG. 12-1, a voltage Vref may be applied to the anodes. In such an arrangement, even if a word line is active (Vhi), and bit line is driven to Vgnd or an erase voltage (+Ve), PMCs may not be programmed or erased. It is understood that a difference between Vref and Vgnd is not sufficient to program a PMC, and a difference between Vref and +Ve is not sufficient to erase a PMC.

FIGS. 12-2 to 12-4 show how setting anodes to Vref maintains memory cells in a de-selected state regardless of whether corresponding bit lines and/or word lines are active or not.

In this way, anodes may be decoded based on an address value as well as driven to particular voltage based on a write data value.

Figure 13:
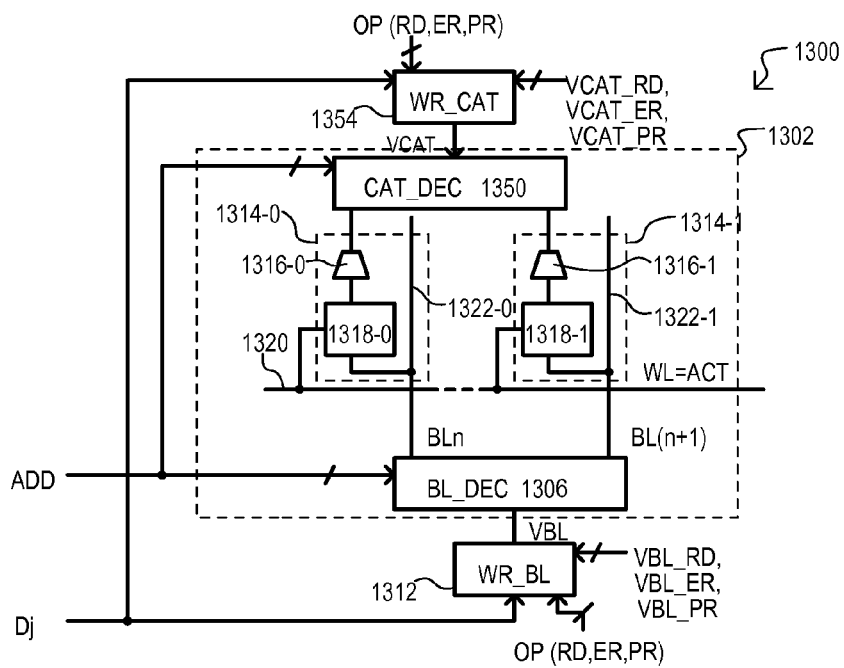
FIG. 13 is a block schematic diagram showing a memory device with program and erase circuits, and data decoded cathodes according to an embodiment.

Referring now to FIG. 13, a PMC memory device according to still another embodiment is shown in a block schematic diagram, and designated by the general reference character 1300. In one example, device 1300 can be one implementation of that shown in FIG. 1. FIG. 13 can include some of the same general features as FIG. 11.

FIG. 13 differs from FIG. 11 in that a PMC memory array 1302 can have a data decoded cathode arrangement. Thus, various mode/data related bit line voltages (VBL_RD, VBL_ER, VBL_PR) can be applied to anodes of PMCs (1316-0 or 1316-1) via access devices (1318-0 or 1318-1). Conversely, various mode/data related cathode voltages (VCAT_RD, VCAT_ER, VCAT_PR) can be applied to a selected cathode via a cathode decoding circuit 1350.

Referring now to FIGS. 14-0 to 14-4, examples of voltages that may be applied to PMC memory cells for a PMC array like that of FIG. 13 are shown in schematic diagrams. FIGS. 13-0 to 13-4 show examples in which an access device is an n-channel transistor.

FIG. 14-0 shows memory cells selected for program and erase operations. A word line is selected by being driven to Vhi. In the case of a programmed cell, a bit line may be driven to a program voltage +Vp, while a corresponding cathode may be driven to a voltage Vgnd. In the case of an erased cell, a bit line may be driven to a voltage Vgnd, while a corresponding cathode may be driven to an erase voltage +Ve. It is understood that a difference between +Vp and Vgnd is sufficient to program a PMC, and a difference between Vgnd and +Ve is sufficient to erase a PMC.

FIG. 14-1 shows a how a memory cell may be de-selected (i.e., prevented from being erased or programmed), even if corresponding bit lines are being driven for program/erase operations, and the word line is active (Vhi). As shown in FIG. 14-1, a voltage Vref may be applied to the cathodes. In such an arrangement, even if a word line is active (Vhi), and bit line is driven to a program voltage (+Vp) or Vgnd or, PMCs may not be programmed or erased. It is understood that a difference between +Vp and Vref is not sufficient to program a PMC, and a difference between Vgnd and Vref is not sufficient to erase a PMC.

FIGS. 14-2 to 14-4 show how setting cathodes to Vref maintains memory cells in a de-selected state regardless of whether corresponding bit lines and/or word lines are active or not.

In this way, cathodes may be decoded based on an address value as well as driven to particular voltage based on a write data value.

The above embodiments show arrangements of "double" decoding, whereby a voltage applied to both terminals of an accessed PMC device can vary according to any of address values, input data and/or mode of operation.

Figure 28:
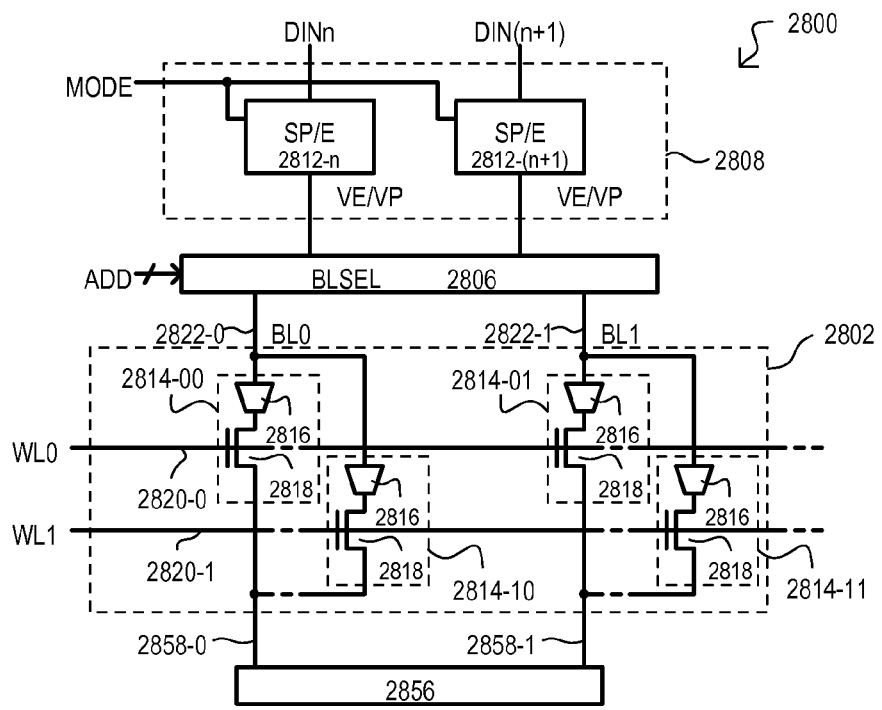
FIG. 28 is a block schematic diagram showing a memory device with program and erase circuits according to a further embodiment.

Referring now to FIG. 28, a memory device according to a further embodiment is shown in block schematic diagram and designated by the general reference character 2000. A memory device 2800 may include items like those shown in other embodiments above, thus like items are referred to by the same reference character but with the leading digits being "28".

The embodiment of FIG. 28 shows one example of a PMC array 2802 having a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This is in contrast to other PMC memory device architectures that have bit lines connected to a corresponding PMC via the access device of the cell.

It is noted that while FIG. 28 shows an arrangement in which one bit line 2822-0/1 is connected to two memory cells accessed by different word lines, other embodiments may have a bit line connected to greater or lesser numbers of PMCs.

PMC array 2802 may also have a "strapped source line" architecture. Within array 2802 groups of access devices 2818 (which are NMOS transistors in this very particular embodiment) may have terminals commonly connected to source nodes 2858-0/1. In very particular embodiments, source nodes 2858-0/1 may be formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line.

It is noted that while FIG. 28 shows source node 2858-0/1 connected to two access devices, other embodiments may have source nodes connected to fewer or greater numbers of access devices. Along these same lines source nodes may have a same or different orientation with respect to bit lines. For example, source nodes may be connected in a same array direction as bit lines (e.g., both connected to memory cells of the same column). As another example, source nodes may be connected to rows of memory cells, while bit lines are connected to columns. Still further, a source node may be connected to larger numbers of memory cells or fewer numbers of memory cells than a corresponding bit line.

Referring still to FIG. 28, source selection circuit 2856 can connect source nodes 2858 to one or more potentials depending upon the mode of operation, and optionally, an address value and/or an input write data value.

In the example of FIG. 28, bit line select circuit 2806 can connect either of program/erase circuits 2812-$n$/(n+1) to a bit line 2822-0/1, to thereby provide a program voltage (VP) or an erase voltage (VE) to an anode of PMC within a memory cell. In one particular embodiment, program or erase voltages (VP or VE) may be applied substantially simultaneously to bit lines to enable PMCs to be programmed in parallel. In a very particular embodiment, such simultaneous program and erase may occur with source selection circuit 2956 maintaining cathodes of selected PMCs at a substantially constant voltage.

While FIG. 28 shows n-channel MOS transistors as access devices 2818, other embodiments may include different types of access devices.

Figure 29A:
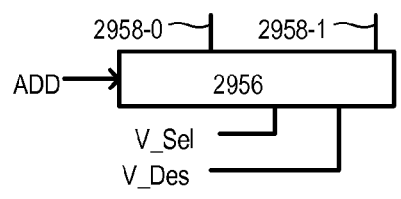
FIGS. 29A and 29B show examples of source selection circuits that may be included in the embodiments.

Referring to FIG. 29A, a source selection circuit 2956 that may be included in an embodiment like that of FIG. 28 is shown in a block schematic diagram. Source selection circuit 2956 may connect a given source node 2958-0/1 to select potential (V_Sel) or a de-select potential (V_Des) based on address data. A select potential (V_Sel) may enable a PMC device to be programmed or erased when a corresponding voltage (VP/VE) is applied to its anode, and the appropriate selection device is enabled. A de-select potential (V_Des) may be a potential applied to a source node 2958-0/1 when its corresponding memory cells are not accessed for a program or erase operation.

Figure 29B:
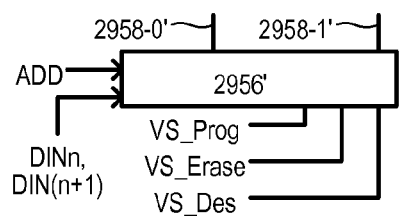

Referring to FIG. 29B, another source selection circuit 2956' that may be included in an embodiment like that of FIG. 28 is shown in a block schematic diagram. Source selection circuit 2956' may connect a given source node 2958-0/1' to a source program voltage (VS_Prog), a source erase voltage (VS_Erase), or a source de-select voltage (VS_Des). A source program voltage (VS_Prog) may enable a PMC to be programmed when a program voltage (VP) is applied to its corresponding anode, and the appropriate access device is enabled. Similarly, a source erase voltage (VS_Erase) may enable a PMC to be erased when an erase voltage (VE) is applied to its corresponding anode, and the appropriate access device is enabled. A de-select potential (V_Des) may be a potential applied to a source node 2958-0/1 when its corresponding memory cells are not accessed for a program or erase operation.

In this way, bit line selection and source selection can be utilized to simultaneously program and/or erase PMCs of an array, where such an array has bit lines directly connected to anodes of PMCs (i.e., not through an intervening selection device).

Also in this way, and source selection can be utilized to program and/or erase PMCs of an array, where such source selection is based on address data and/or incoming write data values.

While embodiments of the invention may include program and erase circuits, other embodiments may include circuits and methods for reading data values from memory cells having storage elements with a programmable impedance, such as programmable metallization cells (PMCs) in a PMC array. Such embodiments can advantageously cancel capacitive current effects arising from structures inherent in the current path from an accessed memory cell to a current sensing circuit. In the various read circuit embodiments shown, like features are referred to by the same reference character but with at first digit corresponding to the particular figure.

Referring now to FIGS. 5-15, a read circuit according to an embodiment is shown in block schematic diagram and designated by the general reference character 1500. A read circuit 1500 can include a bit line voltage regulator 1502, a reference voltage regulator 1504, and a current comparator 1506. Read circuit 1500 can be connected to a memory access structure 1508 and a reference structure 1510.

A memory access structure 1508 can access a storage element programmable between at least two different impedance states. Preferably, such a storage element can include a programmable metallization cell (PMC) having a solid ion conductor disposed between two electrodes (anode and cathode).

A memory access structure 1508 can include physical structures intervening between a bit line node 1512 and the accessed storage element. As but one example, a memory access structure 1508 can include a bit line that can allow current to flow between an accessed storage structure and a bit line node 1512, as well as active devices for enabling such a path. Such access devices can include, for example, column decoding devices, as well as an access device (e.g., transistor) within a memory cell that can selectively connect a storage element to a bit line. As a result, a memory access structure can include an inherent capacitance. In such an arrangement, during a read operation, such an inherent capacitance can present an initial capacitive current "ICAP" in addition to a current drawn by the accessed storage element "IPMC".

A reference structure 1510 can provide a reference current IREF for comparison with current IPMC to determine a data value is stored by an accessed storage element. As but one very particular example, a reference current IREF can be selected to be less than a current drawn by a storage element placed into a low impedance state, but greater than an element placed into a high impedance state.

In particular embodiments, a reference structure 1510 can be designed to mimic the electrical properties presented by memory access structure 1508. In particular, a reference structure 1510 can present a reference capacitance designed to follow the inherent capacitance present in memory access structure 1508. Accordingly, during a read operation, a reference access structure can present an initial capacitive current ICAP" in addition to a reference current IREF. Due to such feature matching, current ICAP' can be the same or essentially the same as current ICAP.

A bit line voltage regulator 1502 can regulate an output voltage (Vout1) at bit line node 1512 in response to a regulation voltage VREG during a read operation. That is, a bit line voltage regulator 1502 will seek to force bit line 1512 to a reference voltage VREF based on a voltage VREG. Voltage VREF can be the same as or different than VREG. At the same time, bit line voltage regulator 1502 can allow a current (Iout1) to flow through to current comparator 1506.

A reference voltage regulator 1504 can operate in the same essential fashion as bit line voltage regulator 1502, and is preferably the same circuit as bit line voltage regulator 1502. Reference voltage regulator 1504 can regulate a voltage (Vout2) at reference node 1514 in response to the same voltage VREG during a read operation. At the same time a current (Iout2) can flow through to current comparator 1506.

A current comparator 1506 can compare a current (Iout1) flowing from bit line voltage regulator 1502 to a current (Iout) flowing from reference voltage regulator 1504 to determine a data state stored by an accessed memory element corresponding to memory access structure 1508.

Figure 15:
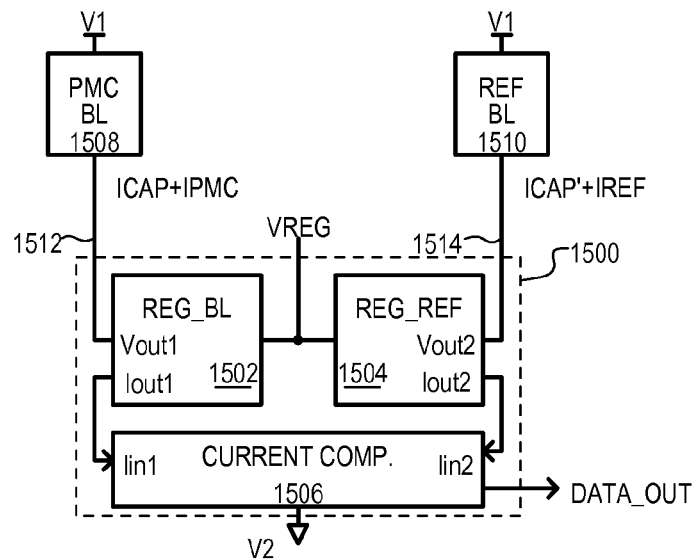
FIG. 15 is a block schematic diagram of a read circuit according to a first embodiment.

As shown in FIG. 15, in a read operation, memory access structure 1508 can generate a current ICAP+IPMC. At the same time, reference access structure 1510 can generate a current ICAP'+IREF. Such currents can flow to compare inputs of current comparator 1506 which can generate an output value based on a difference between such currents. Such an operation can essentially cancel out the effects of inherent capacitance of the memory access structure 1508, as noted by the following relationships.

$$Idiff=(IPMC+ICAP)-(IREF+ICAP'), ICAP \cong ICAP'$$

$$Idiff \cong IPMC-IREF$$

Current comparator 1508 can amplify such a difference to determine a logic value stored by the accessed memory element.

Such an approach, including those shown below and equivalents, can advantageously cancel out unwanted capacitive currents in a read operation of a programmable element that could otherwise lead to read errors.

Such an approach and equivalents can also be faster than other static read approaches. Some static read approaches can establish a static reference voltage across a cell prior to a current measuring operation. This can require longer read times for high resistance memory elements. In addition, establishing such a reference voltage typically utilizes a large voltage regulation amplifier that requires some settling time before the reference voltage can be assured to be accurate. This can also increase read times. Further, such voltage regulation amplifiers are typically complicated circuits that can consume undesirably large areas of an integrated and/or consume undesirably large amounts of current.

The read circuit approaches herein and equivalents are also in contrast to precharge and static read approaches. In precharge and static read operations, accessed storage elements can be precharged to a reference voltage, and then currents from such cells can be read. Such operations can require a voltage regulation amplifier, as in the static case noted above. In addition, precharge operations can result in charge injection and/or charge sharing, which can cause voltage nodes to undesirably vary from their expected potential, which can contribute to errors. A precharge operation further increases read times as it must precede each read operation.

By utilizing capacitive current canceling according to the circuits and techniques shown herein (and equivalents), storage element size can remain advantageously small. That is, other approaches may increase the size of a storage element and hence increase a current drawn by the storage element in order to ensure a parasitic capacitive current will not lead to error. However, such approaches can lead to increased current consumption and/or limit the size of a resulting memory array (e.g., number of cells per bit line), as it may be necessary to maintain sufficiently large ratio between cell current and capacitive current generated by the bit line.

In this way, a read circuit can cancel a capacitive current component for more reliable read operations using voltage regulation at sensing nodes.

Figure 16:
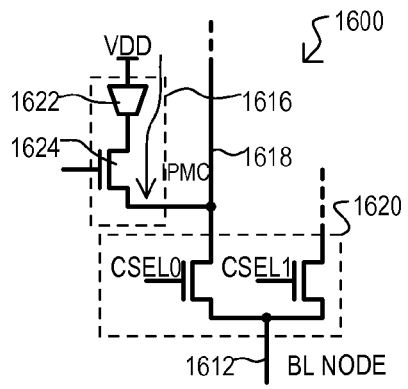
FIG. 16 is a block schematic diagram of one example of a memory access structure that can be included in embodiments of the invention.

Referring to FIG. 16, one example of a memory access structure according to one particular arrangement is shown in a block schematic diagram and designated by the general reference character 1600. In one arrangement, memory access structure 1600 can correspond to item 108 in FIG. 15.

Memory access structure 1600 can include a memory cell 1616, bit line 1618, and column select circuit 1620. A memory cell 1616 can include a PMC element 1622 and an access device 1624. In the particular arrangement shown PMC element 1622 has an anode connected to a high power supply voltage VDD, and a cathode that can be connected to bit line 1618 by access device 1624. Bit line 1618 can be connected to a bit line node 1612 by column select circuits 1620. It is understood that numerous other memory cells can be connected to bit line 1618.

It is noted that anode of PMC memory element 1622 can be maintained at a power supply potential throughout a read operation. That is, the anode is not forced to a lower regulated read bias voltage, or precharged to such a bias voltage.

Figure 17A:
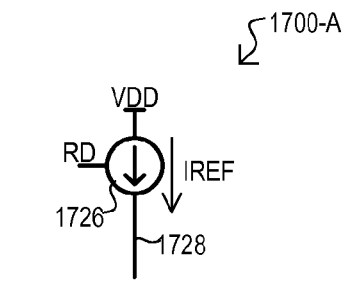
FIGS. 17A to 17C are block schematic diagrams of a reference access structures that can be included in embodiments of the invention.
Figure 17B:
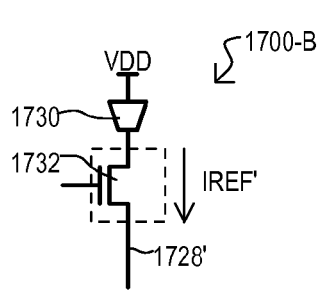
Figure 17C:
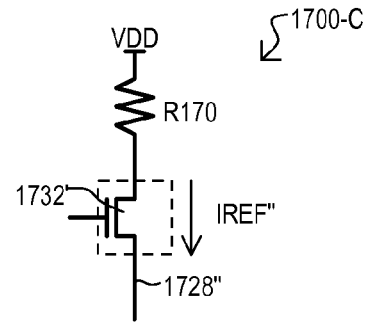

Referring now to FIGS. 17A to 17C, various examples of reference structures according to particular embodiments are shown in block schematic diagrams. Any of these reference access structures can be included in the read circuit embodiments shown herein.

Referring to FIG. 17A, a reference access structure 1700-A can include a controllable reference current source 1726 and a reference bit line 1728. A reference current source 1726 can provide a reference current IREF to a reference bit line 1728 in a read operation. A reference current IREF can provide a current distinguishable from that drawn by a memory element in a particular data state. As but one particular example, if a memory element includes a PMC, then IREF can meet the following relationship:

$$I_{PMC\_Prog} > IREF > I_{PMC\_Erase}$$

Where $I_{PMC\_Prog}$ can be a current drawn by a PMC programmed to a lower resistive state and having a read bias applied, and $I_{PMC\_Erase}$ can be a current drawn by a PMC erased to a higher resistive state and having the same read bias applied.

As noted above, reference bit line 1728 can be fabricated to match a capacitance presented by a selected bit line that accesses a storage element. In one particular arrangement, if a reference access structure 1700-A is used in combination with a structure like that of FIG. 16, reference bit line 1728 can essentially match bit line 1618.

Referring to FIG. 17B, a second example reference access structure 1700-B can include a "dummy" PMC 1730, a reference access device 1732, and a reference bit line 1728'. A dummy PMC 1730 can be formed to draw a current IREF' when reference access device 1732 is enabled. Reference current IREF' can be essentially the same as current IREF of FIG. 17A, being distinguishable from currents drawn by a memory element in a particular data state. It is understood that dummy PMC 1730 can be formed from one or more PMCs. Reference bit line 1728' can be designed to have a capacitance matching a like bit line in a memory access structure.

Referring to FIG. 17C, a third example reference access structure 1700-C can include a reference resistor R170, a reference access device 1732', and a reference bit line 1728". Reference resistor R170 can be formed to draw a current IREF" when reference access device 1732' is enabled. Reference current IREF" can be distinguishable from currents drawn by a memory element in a particular data state. Reference bit line 1728" can be designed to have a capacitance matching a like bit line in a memory access structure.

In this way, a reference access structure can include a current source to distinguish states of an accessed storage element, and in addition, can include physical structures designed to mirror a capacitance presented by a current path to the accessed storage element.

Figure 18A:
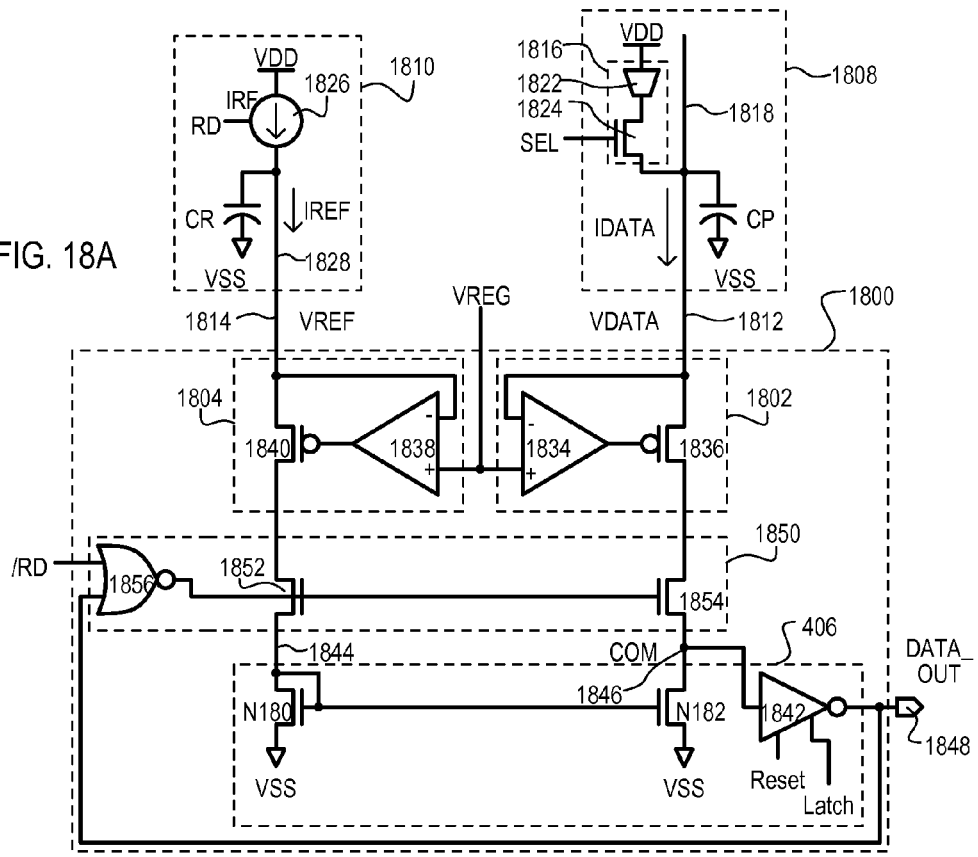
FIG. 18A is a block schematic diagram of a read circuit according to another embodiment.

Referring now to FIG. 18A, another example of a read circuit according to an embodiment is shown. In one particular arrangement, a read circuit 500 can be one version of that shown in FIG. 15.

In FIG. 18A, a memory access structure 1808 can have a configuration like that of FIG. 16 (with column select circuits being omitted to avoid cluttering the view). An inherent capacitance of such a structure is shown as capacitance CP. In this particular example, a reference structure 1810 can have a configuration like that of FIG. 17A. A capacitance built into such a structure is shown as CR. It is understood that CR is preferably as close to CP as possible.

Referring still to FIG. 18A, in the particular example shown, a bit line voltage regulator 1802 can include a first amplifier 1834 and bit line current regulation device 1836. First amplifier can have a (+) input connected to receive a regulation voltage VREG, and a (−) input connected to bit line node 1812. Bit line current regulation device 1836 can control the amount of current flowing from bit line node 1812 to current comparator based on the output from first amplifier 1834. In FIG. 18A, bit line current regulation device 1836 can be a p-channel insulated gate field effect (hereinafter MOS) transistor having a source-drain path connected between bit line node 1812 and current comparator 1806, and a gate connected to the output of first amplifier 1834.

In such an arrangement, bit line voltage regulator 1802 can to force voltage VDATA at bit line node 1812 to follow VREG. If voltage VDATA rises above VREG, output of first amplifier 1834 can be driven lower, reducing the resistance of bit line current regulation device 1836 and allowing circuits within current comparator 1806 to pull bit line node 1812 lower. Conversely, if voltage VDATA falls below VREG, output of first amplifier 1834 can be driven higher, increasing the resistance of bit line current regulation device 1836, and allowing memory cell 1816 to pull bit line node 1812 higher.

A reference voltage regulator 1804 can be constructed to match bit line voltage regulator 1802. Thus, reference voltage regulator 1804 can include a second amplifier 1838 and a reference current regulation device 1840 having the same general configuration, but providing a current path between reference node 1814 and current comparator 1806. In a read operation, reference voltage regulator 1804 can operate to try and force a voltage (VREF) at reference node 1814 to about VREG.

In the example of FIG. 18A, a current comparator 1806 can include a current mirror formed by n-channel MOS (NMOS) transistors N180 and N182, and output logic 1842. Transistor N180 can have a gate and drain connected to a reference comparator input 1844, and a source connected to a low power supply node VSS. Transistor N182 can have a drain connected to a data comparator input 1846, a gate connected to the gate-drain of transistor N180, and a source connected to low power supply node VSS. Output logic 1842 can drive a data output (DATA_OUT) 1848 high when a potential at data comparator input 1846 (COM) falls below a logic threshold level, and can drive data output 1848 low when high when a potential at data comparator input 1846 rises above a logic threshold level. In the example shown, output logic 1842 can be an inverter that can latch output data in response to a latch signal "Latch", and can be reset to a predetermined output level (e.g., low), in response to a reset signal "Reset".

The read circuit 1800 of FIG. 18A also includes a read enable circuit 1850. A read enable circuit 1850 can connect current paths to current comparator 1806 to thereby enable a read operation to occur. In FIG. 18A, read circuit 1850 includes a reference enable device 1852, a data enable device 1854, and read control logic 1856. In response to a read enable signal /RD and a data output signal DATA_OUT, read control logic 1856 can place reference and data enable devices (1852 and 1854) into low impedance states to enable a read operation, and high impedance states to disable/stop a read operation. In the particular example shown, read control logic 1856 can be a two-input NOR gate.

Having described the various sections of the read circuit shown in FIG. 18A, the operation of this circuit will now be described. Prior to a read operation, read enable signal /RD can be high, and read control logic 1856 can place reference and data enable devices (1852 and 1854) into high impedance states. Signal DATA_OUT can be reset to a low logic level in anticipation of the read operation.

In a read operation, bit line voltage regulator 1802 and reference voltage regulator 1804 can drive bit line node 1812 and reference node 1814 to voltage VREG. Preferably, anodes of storage elements can already be connected to a suitable voltage, in this case a supply voltage VDD.

Having anodes of storage elements at VDD prior to and during a read operation is in sharp contrast to previously mentioned approaches that can drive such anodes to a read bias voltage, or precharge such anodes to some a read voltage. This can allow the embodiments to have faster read operations, as bias voltage regulation is not needed at such nodes, and/or allow for lower power consumption or smaller device size, as a large voltage regulator is not needed to drive anode connections.

With anode voltages set at VDD, and bit line node 1812 and reference node 1814 driven to VREG, read enable signal /RD can transition low. Because signal DATA_OUT has previously been preset low, read control logic 1856 can place reference enable device 1852 and a data enable device 1854 into low impedance states. As a result, current from reference node 1814 can flow to load transistor N180. The bias state of transistor N182 mirrors that of transistor N180. Consequently, if a current flowing into data comparator input 1846 is greater than that flowing into reference comparator input 1844 (e.g., memory element 1822 is programmed), a potential at data comparator input 1846 can rise, and output logic 1842 can drive DATA_OUT low. In contrast, if a current flowing into data comparator input 1846 is less than that flowing into reference comparator input 1844 (e.g., memory element 1822 is erased), a potential at data comparator input 1846 can fall, and output logic 1842 can drive DATA_OUT high. In this latter case, the high DATA_OUT signal can cause read control logic 1856 to turn off reference enable device 1852 and data enable device 1854.

The above noted automatic turn off feature in the case of a high DATA_OUT signal can advantageously ensure that an accessed memory element is exposed to a read potential for only the time necessary to generate a read signal. In the case of PMC memory elements, this can minimize the exposure of an erased PMC from a read potential, thus providing protection from read disturb (i.e., read potentials unintentionally placing an erased PMC into a lower impedance programmed state).

In this way, a read circuit can sense a data state of a PMC memory device having anodes commonly connected to a stable voltage, maintain regulated voltages at a selected bit line node and corresponding reference node with matching amplifiers, and can enable sensing current paths with read enable logic, including automatically disabling such paths once a particular data value is detected.

Figure 18B:
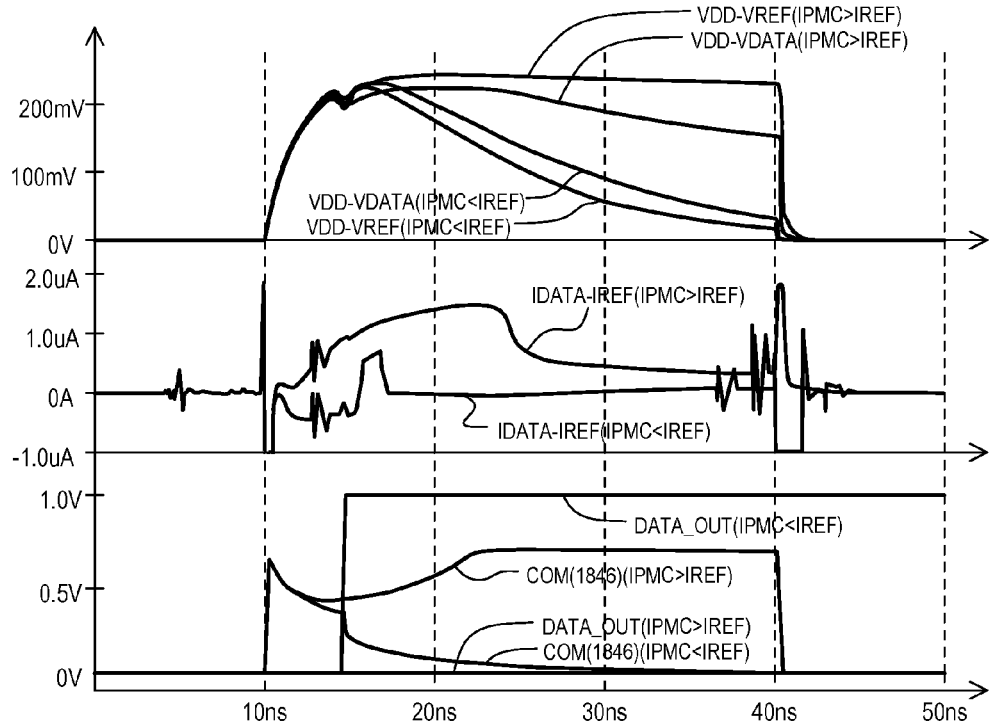
FIG. 18B includes timing diagrams showing particular operations of the circuit shown in FIG. 18A.

Referring to FIG. 18B, a series of timing diagrams show one example of simulation results for one version of the embodiment of FIG. 18A.

FIG. 18B includes a first timing diagram showing a potential difference between a high supply voltage VDD and a voltage at bit line node 1812 (VDD−VDATA), and the difference between VDD and the reference node 1814 (VDD−VREF) for two conditions: IPMC>IREF (e.g., memory element in programmed state), and IPMC<IREF (e.g., memory element in erased state).

FIG. 18B also includes a second timing diagram showing a current difference IDATA−IREF for the two conditions.

FIG. 18B includes a third timing diagram showing a response at data comparator input 1846 (COM) as well as the signal DATA_OUT for the two conditions.

Figure 19:
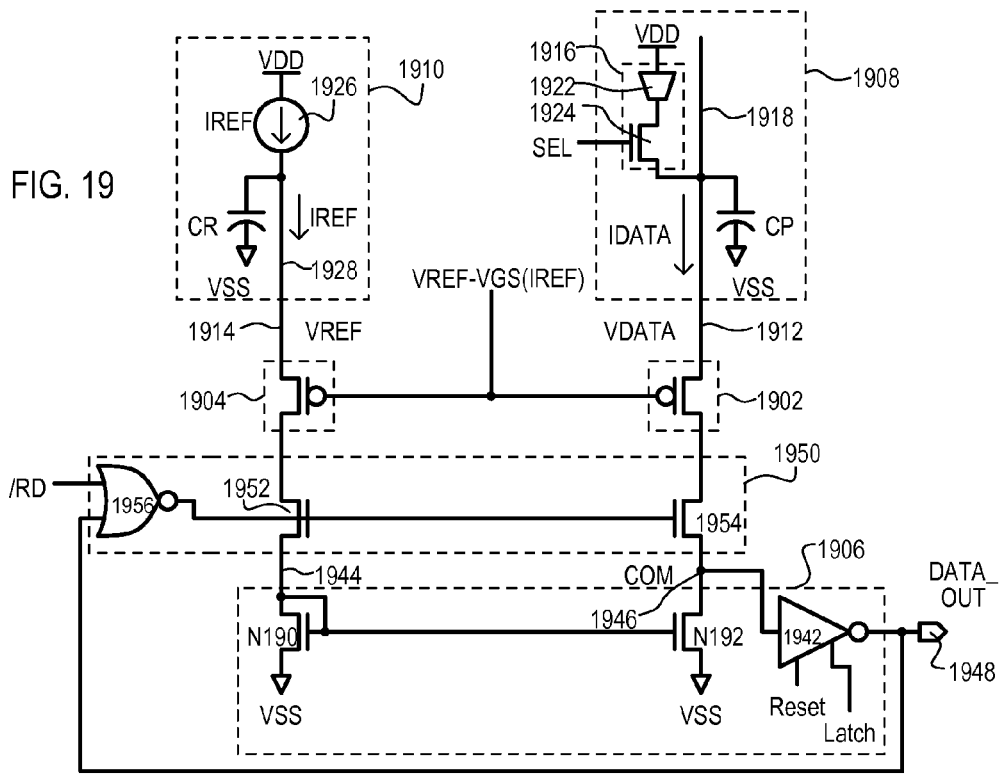
FIG. 19 is a block schematic diagram of a read circuit according to a further embodiment.

Referring now to FIG. 19, another example of a read circuit according to an embodiment is shown in a schematic diagram. In one particular arrangement, a read circuit 1900 can be one version of that shown in FIG. 15.

FIG. 19 includes many of the same features as FIG. 18A. FIG. 19 differs from FIG. 18A in that bit line voltage regulator 1902 and reference voltage regulator 1904 are each formed by PMOS transistors. In particular, bit line voltage regulator 1902 can include a PMOS transistor having a source-drain path connected between bit line node 1912 and read enable circuit 1950, and a gate that receives a regulation voltage VREF−VGS(IREF). In the same fashion, reference voltage regulator 1904 can include can include a PMOS transistor having a source-drain path connected between reference node 1914 and read enable circuit 1950, and a gate that receives the same regulation voltage VREF-VGS(IREF). A voltage VREF can be the desired reference voltage applied at bit line and reference nodes (1912 and 1914). A voltage VGS(IREF) can be a gate-source voltage necessary for the PMOS transistors to source a current of IREF.

In the event memory element 1922 has a higher impedance state (e.g., is erased), bit line node 1912 can fall with respect to reference node 1914. As a result, data comparator input 1946 can likewise fall, resulting in signal DATA_OUT transitioning high. In the event memory element 1922 has a lower impedance state (e.g., is programmed), bit line node 1912 can rise with respect to reference node 1914. As a result, data comparator input 1946 can likewise rise causing signal DATA_OUT to transition low.

An arrangement like that of FIG. 19 can provide weaker regulation than an amplifier configuration like that shown in other embodiments. However, by not including such amplifiers, current consumption can be reduced. In addition, weaker regulation can allow a bias voltage to drop when a memory element has a lower impedance state (e.g., a PMC is programmed). This can expose the memory element to a smaller voltage during a read operation (as compared to stronger regulation arrangements), which in turn can reduce read disturb (i.e., in the case of a PMC, the undesirable lowering of a memory element impedance caused by the application of read voltage).

Figure 20:
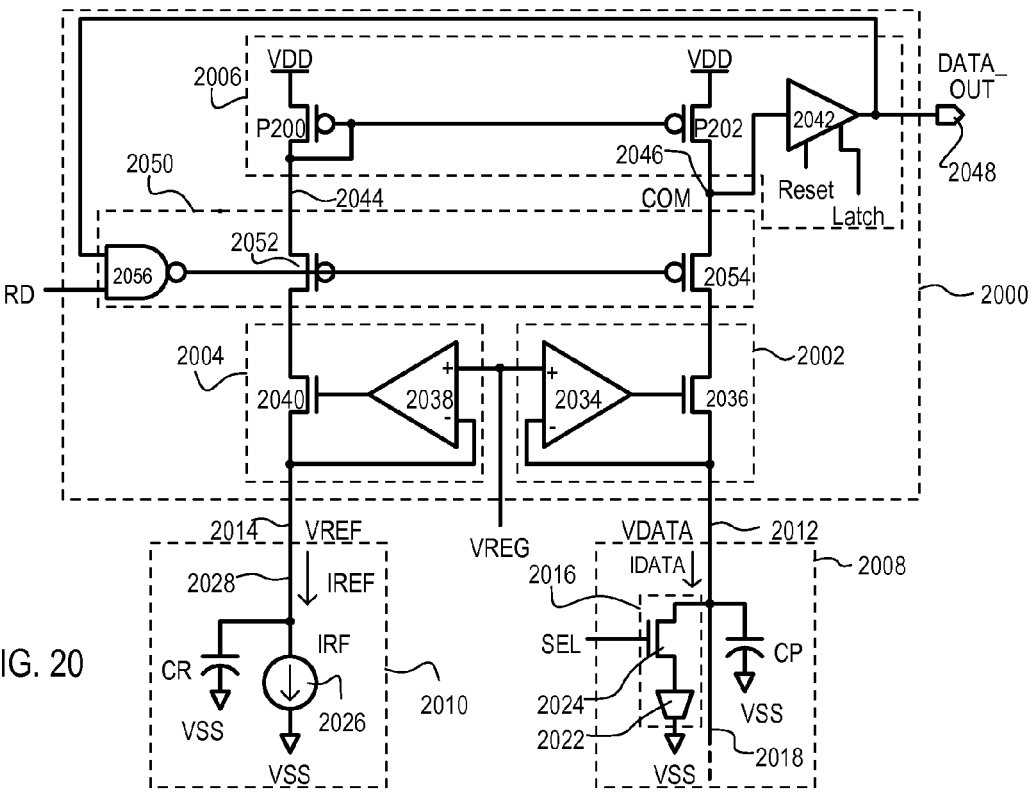
FIG. 20 is a block schematic diagram of a read circuit according to yet another embodiment.

Referring now to FIG. 20, another example of a read circuit according to an embodiment is shown. In one particular arrangement, a read circuit 2000 can be one version of that shown in FIG. 15.

FIG. 20 has the same general configuration as FIG. 18A. However, FIG. 20 shows a read circuit compatible with a "common cathode" type PMC memory cell array. That is, unlike FIG. 18A where terminals (i.e., anodes) of a memory elements are connected to a high power supply voltage VDD, FIG. 20 shows memory elements with terminals (i.e., cathodes) connected to a low power supply voltage VSS.

As one skilled in the art would recognize, due to such an arrangement, in FIG. 20, current directions, power supply connections and transistor conductivities can be reversed as compared to FIG. 18A. Likewise, output logic 2042 provides a non-inverting function and read control logic 2056 can be a NAND gate. From the teachings shown in FIG. 20, the other embodiments having common anode arrangement are understood to have corresponding common cathode versions.

In this way, the various embodiments can be compatible with PMC arrays having common anode or common cathode configurations.

Referring now to FIG. 21, another example of a read circuit according to an embodiment is shown. In one particular arrangement, a read circuit 2100 can be one version of that shown in FIG. 15.

FIG. 21 includes many of the same features as FIG. 18A. FIG. 21 differs from FIG. 18A in the type of regulation being employed. In FIG. 18A, regulation can be with a source follower circuit, while in FIG. 21, regulation can be with an active current mirror circuit. In such an arrangement, bit line current regulation device 2136 and reference current regulation device 2140 can be connected to a lower power supply node VSS.

Differential current comparator 2158 can include a data input device 2160, a reference input device 2162, and a load circuit 2164. A data output signal COM can be generated at a connection between reference mirror device 2162 and load circuit 2164. Data mirror device 2160 can mirror the operation of bit line current regulation device 2136. In the same fashion, reference mirror device 2162 can mirror the operation of reference current regulation device 2140. In response to different output voltages from first amplifier 2134 (corresponding to different states of memory element 2122), the impedance of data input device 2160 will be higher or lower. This change will cause output signal COM to rise or fall in a corresponding fashion.

In the very particular example of FIG. 21, data input device 2160 can be an NMOS transistor having a source-drain path connected between active load circuit 2164 and a low power supply voltage VSS, and a gate connected to the output of first amplifier 2134. In a mirror image fashion, reference input device 2162 can be an NMOS transistor having a source-drain path connected between load circuit 2164 and a low power supply voltage VSS, and a gate connected to the output of second amplifier 2138. Load circuit 2164 can be an active load current mirror formed with PMOS transistors P214 and P216. Transistors P214/P216 can have sources commonly connected to a high power supply voltage node VDD, and gates connected to one another. A drain of transistor P216 can be connected to a drain of reference input device 2162. A gate and drain of transistor P214 can be connected to a drain of data input device 2160.

In this way, a read circuit can have a differential current sensing configuration.

Figure 22C:
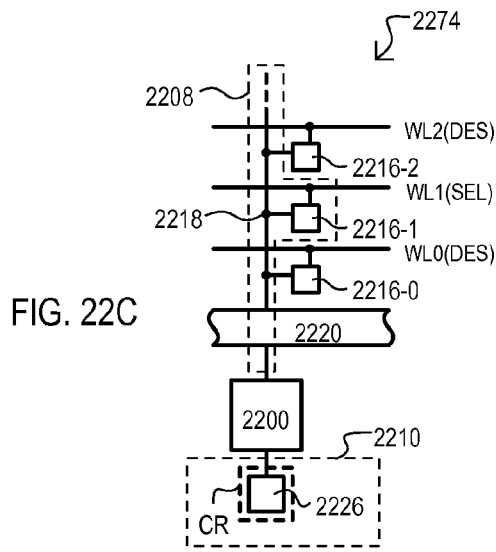

Referring now to FIGS. 22A to 22C, three of the many possible examples of a circuit arrangement according to embodiments of the invention are shown in top plan views.

Referring to FIG. 22A, a device 2270 is represented by a top plan view that shows examples of physical locations for various circuit sections of the embodiments shown herein. The arrangement of FIG. 22A shows an "open" bit line arrangement. In such an arrangement, a read circuit 2200 can be connected between two bit lines 2218 and 2218' by column select circuits 2220-0 and 2220-1. In a read operation, one bit line can be connected to a selected memory cell, while the other bit line functions as part of a reference access structure 2210. A reference current source 2226 can be connected to either bit line 2218 or 2218' according to a select signal REF_SEL. A reference current source 2226 can take the form of any of the structures shown herein, including those of FIGS. 17A to 17C, and equivalents.

FIG. 22A shows a read operation of memory cell 2216-1. In such an operation, corresponding word line WL1 is driven to a select potential while the other word lines corresponding to bit lines 2218 and 2218' are all driven to de-select potentials. Thus, memory cell 2216-1 can be connected to bit line 2218, while memory cells 2216-0, 2216-2, and 2216-$n$ to 2216-$n$+2 can be isolated from bit lines 2218 and 2218'. A reference current source 2226 can be connected to bit line 2218'. Accordingly, as shown in FIG. 22A, bit line 2218 can serve as a portion of a memory access structure 2208, while bit line 2218' can form part of reference access structure 2210. It is understood that if any of memory cells 2216-$n$ to 2216-$n$+2 are read, bit line 2218' would from part of a memory access structure, and reference current source 2226 would be connected to bit line 2218, which would form part of reference access structure.

FIG. 22B shows the same general arrangement as FIGS. 5-22A, but with a "folded" bit line architecture. In such an arrangement, bit lines are disposed on a same side of read circuit 2200.

FIG. 22C shows another arrangement in which a reference access structure 2210' can have a different structure than a bit line. For example, a capacitor CR can be formed over a reference current source 2226.

Of course FIGS. 22A to 22C, are but three particular examples, and should not necessarily be construed as limiting to the invention.

Figure 23:
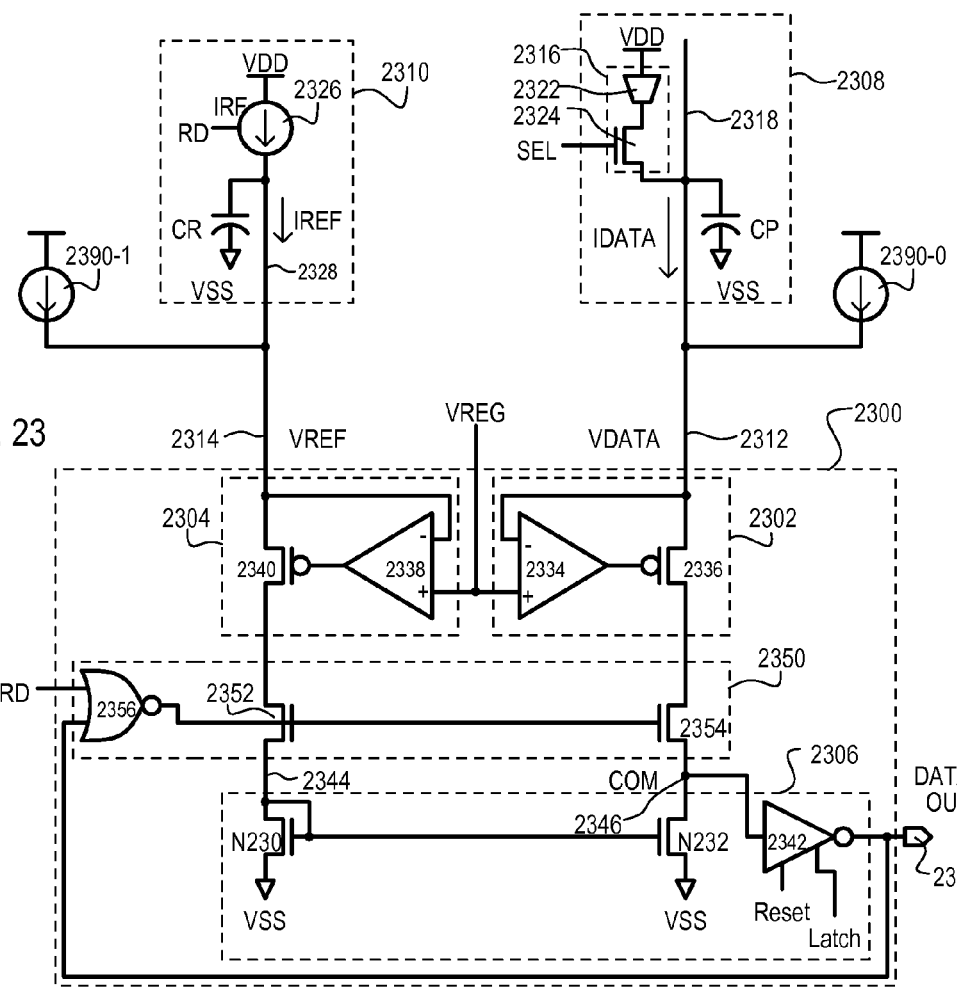
FIG. 23 is a schematic diagram of a read circuit according to an embodiment.

Referring now to FIG. 23, another example of a read circuit according to an embodiment is shown in a schematic diagram. In one particular arrangement, a read circuit 2300 can be one version of that shown in FIG. 15.

FIG. 23 includes many of the same features as FIG. 18A. FIG. 23 differs from FIG. 18A in that it can include a quiescent current sources 2390-0 and 2390-1. Quiescent current sources (2390-0 and 2390-1) can be included in applications in which a large variation in the impedance of a memory element 2322 is expected. Quiescent current sources 2390-0 and 2390-1 can provide a predetermined current to both bit line 2312 and reference node 2314. In a sense operation, such currents can cancel one another out, while at the same time improving amplifier performance when sensing wider impedance ranges.

While various embodiments above have shown program and erase circuits and read circuits, other embodiments can include circuits and methods that can perform any combination of read, program, or erase operations on programmable metallization cells (PMCs) utilizing the same circuit. Current shunting can be used to regulate a voltage across a PMC and/or determine when an operation (e.g., read, program or erase) is complete. Various embodiments utilizing such current shunting will now be described.

Referring to FIG. 24, a shunt regulation circuit according to a first embodiment is shown in a schematic diagram and designated by the general reference character 2400. A shunt regulation circuit 2400 can include a PMC 2402 and a biasing circuit 2404.

In the arrangement of FIG. 24, a PMC 2402 can be connected between a shunt node 2410 and a first power supply node VSS, in read and program operations.

A biasing circuit 2404 can include a current source 2406 and a unidirectional voltage source 2408. A current source 2406 can be connected between a second power supply voltage node VDD and a shunt node 2410, and can provide a reference current value IREF to a shunt node 2410. A magnitude of current IREF can vary between operations (i.e., read, program).

A unidirectional voltage source 2408 can force a predetermined voltage VREF across PMC 2402. Voltage source 2408 can be "unidirectional" with respect to how current flows through the voltage source. In the arrangement of FIG. 24, current can flow from shunt node 2410 through voltage source 2408, but not from voltage source 2408 to shunt node 2410. Thus, with respect to shunt node 2410, current provided by voltage source 2408 can be same as that through PMC 2402 (i.e. both sink current from shunt node 2410). Voltage source 2408 can be connected in parallel with PMC 2402 between shunt node 2410 and first power supply node VSS, and provide a reference voltage VREF between these two nodes. A magnitude of a reference voltage VREF can vary between operations (i.e., read, program, erase).

FIG. 24 shows a common cathode type arrangement. It is understood that memory device 2400 can include multiple PMC having cathodes commonly connected to a same node (in this configuration first power supply node VSS).

In an arrangement like that of FIG. 24, as noted above, current source 2406 can provide a current IREF to shunt node 2410. A current IPMC can flow through PMC 2402, while a current IS may flow through voltage source 2408. Depending upon a state of PMC 2402, the amount of current "shunted" by voltage source 2408 can vary. More particularly, if a PMC 2402 has a first state (i.e., programmed), it can have a relatively low impedance, thus a current value for IS can be small, or even zero. Conversely, if a PMC 2402 has a second state (i.e., erased) it can have a relatively high impedance, thus a value for IS can be large, up to a value IREF (that sourced by current source 2406).

FIG. 25A shows a read operation for the shunt regulation circuit shown in FIG. 24. Voltage VREF provided by voltage source 2408 can be set to a voltage less than a threshold voltage ($Vt_{PMC}$) used to program a PMC 2402. A current provided by current source 2404 can be a program current IREF_Read. A current sunk by voltage source 2408 will vary according to the impedance of PMC 2402. Even more particularly, if PMC 2402 has a higher impedance (i.e., is erased), Iread will have a relatively high value, as it will sink more current from current source 2406. If PMC 2402 has a lower impedance (i.e., is programmed), Iread will have a relatively low value, as PMC 2402 will sink most (or all) of the current provided by current source 2406.

FIG. 25B shows a program operation for the shunt regulation circuit shown in FIG. 24. Voltage VREF provided by voltage source 2408 can be set to a voltage greater than a threshold voltage ($Vt_{PMC}$) used to program a PMC 2402. That is, voltage VREF can be greater than that necessary to induce a change in impedance in PMC 2402. A current provided by a current source 2408 can be a program current IREF_Prog. As in the read operation, a current sunk by voltage source 2408 will vary according to the impedance of PMC 2402. More particularly, initially, a PMC 2402 will be unprogrammed, and thus have a relatively high impedance. Consequently, at the start of a program operation, a current (Iprog) sunk by voltage source 2408 can be relatively high as most of the current sourced by current source 2406 is sunk by voltage source 2408. However, as the PMC 2402 programs, its impedance will fall, resulting in the PMC 2402 sourcing more current. Consequently, as the PMC 2402 programs, a current (Iprog) sunk by voltage source 2408 can make a transition from a larger value to a smaller value, as more current from current source 2406 is being sunk by the programmed PMC 2402. Such a change in Iprog can provide an indication that the PMC 2402 is programmed.

Optionally, a shunt regulation circuit 2400 can also erase a PMC 2402. One configuration for doing so is shown in FIG. 25C. FIG. 25C shows the same general configuration as FIG. 24, but also shows an erase switch 2412 connected between a shunt node 2410 and current source 2406. In read and/or program operations, erase switch 2412 can be closed (i.e., can provide a low impedance), and read and/or program operations can occur as noted above for FIGS. 25A and 25B.

In an erase operation however, erase switch 2412 can be open (i.e., can provide a high impedance). Alternatively, a current source 2406 can be disabled to provide a high impedance with respect to shunt node 2410. A voltage source 2408 can provide a predetermined voltage Verase at shunt node 2410. A voltage Verase can be zero, or even a negative voltage. A cathode of PMC 2402 can be driven to an erase voltage VCAT_ER, which can be greater than a potential at shunt node 2410 by more than an erase threshold voltage. In an erase operation, a current sunk by voltage source 2408 will vary according to the impedance of PMC 2402. More particularly, initially, a PMC 2402 will be programmed, and thus have a relatively low impedance. Consequently, at the start of an erase operation, a current (Ierase) sunk by voltage source 2408 can be relatively high. However, as the PMC 2402 erases, its impedance will rise, resulting in the PMC 2402 providing less current. Consequently, as the PMC 2402 erases, a current (Ierase) sunk by voltage source 2408 can make a transition from a larger value to a smaller value. Such a change in Ierase can provide an indication that the PMC 2402 is erased.

While FIGS. 24 to 25C show an arrangement having a common cathode, alternate embodiments can include a common anode configuration. One example of such an arrangement is shown in FIG. 26.

Referring to FIG. 26, a shunt regulation circuit 2600 can include some of the same general features as FIG. 6-1, accordingly, like features are shown by the same reference characters but with the first digits being a "26" instead of "24".

Shunt regulation circuit 2600 can differ from that of FIG. 24 in that a PMC 2602 can be connected between a shunt node 2610 and a first power supply node VDD, in a program and read operations. A biasing circuit 2604 can include a current source 2606 and a unidirectional voltage source 2608. A current source 2606 can be connected between a second power supply voltage node VSS and shunt node 2610, and can sink a reference current IREF from a shunt node 2610. A magnitude of current IREF can vary between operations (i.e., read, program, erase).

A unidirectional voltage source 2608 can force a predetermined voltage VREF at shunt node 2610. In the arrangement of FIG. 26, the unidirectionality of voltage source 2608 is the opposite to that of FIG. 24. That is, voltage source 2608 will source current to, but not sink current from, the shunt node 2610. Thus, with respect to shunt node 2610 current provided by voltage source 2608 can be same as that through PMC 2602 (i.e. both source current to shunt node 2610). A magnitude of a reference voltage VREF can vary between operations (i.e., read, program, erase).

In a read operation, PMC 2602 will source current to shunt node 2610 and current source 2606 can sink a current from shunt node 2610. Voltage source 2608 will generate a voltage at shunt node 2610 that results in a potential across PMC 2602 that is less than a threshold voltage ($Vt_{PMC}$). If PMC 2602 is programmed, it will source a relatively large current, as a result, voltage source 2608 will source a relatively small (or no) current to meet the current value sunk by current source 2606. Conversely, if PMC 2602 is erased, it will source a relatively small current, and as a result, voltage source 2608 will source a relatively large current to meet the current amount sunk by current source 2606. Such variations of current flowing through voltage source 2608 may determine a read data value.

In a program operation, voltage source 2608 will generate a voltage at shunt node 2610 that results in a potential across PMC 2602 that is greater than a threshold voltage ($Vt_{PMC}$). As an impedance of PMC 2602 transitions from a relatively high value to a relatively low value, a current (IS) sourced by voltage source 2608 can transition from a high value to a low value, which can signify the programming of the PMC 2602.

In an erase operation, an erase switch 2612 can have a high impedance and/or a current source 2606 can be disabled to provide a high impedance. An anode of PMC 2602 can be driven to an erase voltage (which can be VSS as but one particular example), while voltage source 2608 will generate a voltage at shunt node 2610 that results in a potential across PMC 2602 that is greater than an erase threshold voltage ($Vt_{PMC}$). As an impedance of PMC 2602 transitions from a relatively low value to a relatively high value, a current (IS) sourced by voltage source 2608 can transition from a high value to a low value, signifying the erasing of the PMC 2602.

In this way, a device such an integrated circuit, can include a shunt regulation circuit that can both read, program and erase PMC devices with a same circuit. Such a circuit can provide such functions operating at relatively low voltages (i.e., power supply voltages) and thus does not necessarily need charge pump circuits or additional erase or program power supplies, as can occur in conventional arrangements.

Additionally, such read, program and erase operations are advantageously voltage limited with respect to the PMC. That is, in the case of the common cathode arrangement, a voltage source constrains the voltage presented across a PMC. Similarly, in the common anode arrangement, a voltage source, and voltage applied at the anode of the PMC, controls the voltage presented across the PMC terminals.

Embodiments shown herein can equivalents can provide for relatively fast reads of high impedance states of PMC.

The above embodiments are in contrast to conventional approaches that can provide separate circuits for read, program and erase operations, requiring a large amount of area in an integrated circuit device.

The above embodiments are also in contrast to approaches that either program with only a current source or only a voltage source. In the former arrangement, a voltage across a PMC may not be controlled, which can lead to read disturb (undesired programming caused by read operations) in a read operation, or over-programming in a programming operation. In the latter case, a current through a PMC may not be controlled.

Figure 27A:
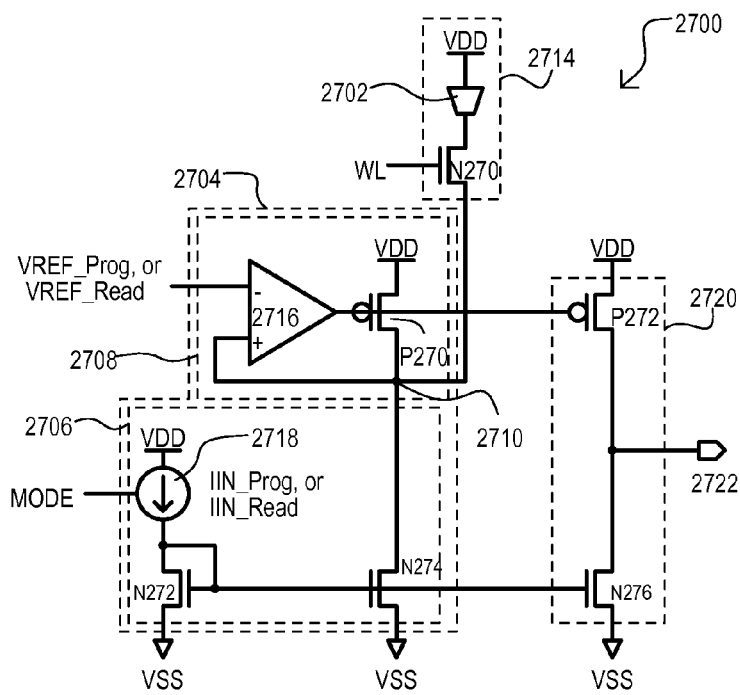
FIGS. 27A and 27B are schematic diagrams of shunt regulation circuits according to yet further embodiments.
Figure 27B:
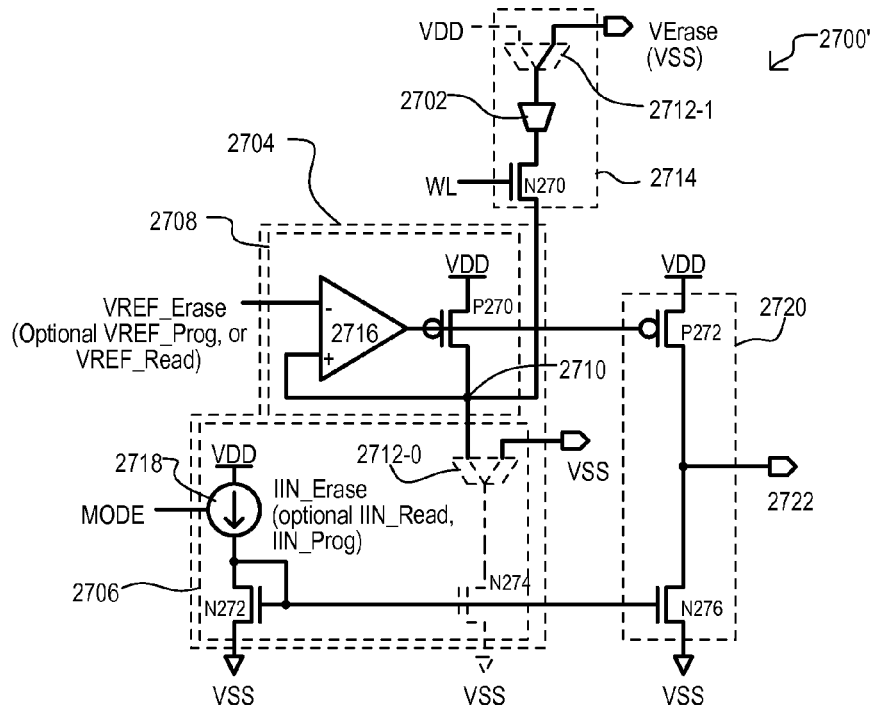

Referring now to FIGS. 27A and 27B, additional examples of shunt regulation circuits having a common anode configuration are shown in schematic diagrams. Shunt regulation circuit 2700 of FIG. 27A can include some of the same general features as FIG. 24, thus like features are shown by the same reference character but with the leading digits being "27" instead of "24". FIG. 27A shows a circuit configuration for a read or program operation. FIG. 27B shows a circuit configuration for an erase operation.

Referring to FIG. 27A, a shunt regulation circuit 2700 can access a memory cell 2714 to read or program a PMC 2702. A memory cell 2714 can include PMC 2702 having an anode connected to a first power supply node VDD and a cathode connected to shunt node 2710 by an access device N270. In the particular example shown, an access device N270 can be an n-channel insulated gate (hereinafter NMOS) transistor. Transistor N270 can be placed into a high or low impedance according to a word line signal WL. It is understood that memory cell 2714 could be connected to shunt node 2710 by intervening circuits, such as column select circuits that selectively connect different memory cells to shunt node 2710 based on address data.

A current source 2706 can include a reference current source 2718, a first NMOS transistor N272, and second NMOS transistor N274. A reference current source 2718 can be connected between a first power supply node VDD and a drain of NMOS transistor N272. Reference current source 2718 can provide a current based on a MODE value. According to MODE value, in a read operation, a current can have a first value IIN_Read. In a program operation, a current can have a second value IIN_Prog. Transistors N272 and N274 can have a current mirror configuration, with transistor N272 having a gate connected to its drain and to the gate of transistor N274. Transistor N274 has a source-drain path connected between shunt node 2710 and a second power supply node VSS. In such an arrangement, a current provided by reference current source 2718 can be mirrored by transistor N274, and thus sink current from shunt node 2710.

A voltage source 2708 can include an amplifier 2716 and a regulating p-channel MOS (PMOS) transistor P270. An amplifier 2716 can be an operational amplifier having a (−) terminal connected to receive a reference voltage. Such a reference voltage can be VREF_Read in a read operation, and VREF_Prog in a program operation. A (+) terminal of amplifier 2716 can be connected to shunt node 2710. An output of amplifier 2716 can drive a gate of transistor P270. Transistor P270 can have a source-drain path connected between a first power supply node VDD and shunt node 2710. In such an arrangement, when a voltage at shunt node 2710 rises above a reference voltage (VREF_Read or VREF_Prog), amplifier 2716 can increase the impedance of transistor P270, thus allowing shunt node 2710 to be pulled lower by current source 2706. Conversely, when a voltage at shunt node 2710 falls below a reference voltage (VREF_Read or VREF_Prog), amplifier 2716 can decrease the impedance of transistor P270, thus pulling shunt node 2710 higher. In this way, voltage source 2708 can regulate the voltage at shunt node 2710 to follow the applied reference voltage (VREF_Read or VREF_Prog).

A shunt regulation circuit 2700 can also include an output section 2720 which can indicate when a particular amount of current is shunted by voltage source 2708. In the particular arrangement of FIG. 27A, output section 2720 can include a PMOS transistor P272 and an NMOS transistor N276 having source-drain paths arranged in series. A gate of transistor P272 can be connected to an output of amplifier 2716. A gate of transistor N276 can be connected to the gate-gate connection of current mirror N272/N274.

Having described the configuration of the embodiment shown in FIG. 27A, the operation of the embodiment will now be described. A current (IIN_Prog or IIN_Read) provided by reference current source 2718 can be mirrored to N274 through N272. As noted above, transistor P270 can be controlled by amplifier 2716 to source current to shunt node 2710, and thereby maintain it at the applied reference voltage (VREF_Prog or VREF_Read).

In a read operation, transistor N270 can be enabled, connecting PMC 2702 between shunt node 2710 and a high power supply node VDD. A reference voltage applied to amplifier 2716 can be VREF_Read, and a current provided by reference current source 2718 can be IIN_Read. In such an arrangement, a current sourced by transistor P270 can be mirrored to transistor P272. Within output section 2720 a current sourced by transistor P272 can be compared with the current mirrored by N276 (which can be the same as, or proportional to the current provided by reference current source 2718). In such a comparison, output node 2722 can be driven high by transistor P272 or low by transistor N276 to thereby indicate the amount of current being shunted by voltage source 2708, and thus signify the state of the accessed PMC 2702 (i.e., programmed or erased). It is noted that a ratio of N276 and N274 and/or P270 and P272 can be changed to provide a desired sensing margin.

In a program operation, like a read operation, transistor N270 can be enabled connecting PMC 2702 between a power supply node VDD and shunt node 2710. A reference voltage applied to amplifier 2716 can be VREF_Prog, which can establish a potential between shunt node 2710 and power supply node VDD that is above the threshold voltage ($Vt_{PMC}$) for programming PMC 2702. A current from reference current source 2718 can be IIN_Prog, which can be the desired current level for achieving a target impedance value for PMC 2702. In such an arrangement, transistor P270 can source all of the current required by transistor N274 until PMC 2702 starts to program to a lower impedance state. When PMC 2702 device begins to program, P270 can start to source less current as PMC 2702 sources more current. In one arrangement, this can continue until all, or nearly all current can be sourced by PMC 2702 and not transistor P270. As in the read operation, current provided by transistor P270 can be mirrored by transistor P272 and a current through N274 can be mirrored by N276. Thus, output section 2720 can act as a current comparator to determine when PMC 2702 is at a desired impedance. In one particular example, transistor N276 can sink much less current than N274 when almost zero current is sourced by P270 (i.e., PMC 2702 is programmed), thus output node 2722 can be pulled low signifying a programmed state.

In this way, a PMC can be read and programmed with a single circuit using current shunting from a voltage regulated node.

Referring to FIG. 27B, a shunt regulation circuit 2700′ like that of FIG. 27A is shown in a schematic diagram. Shunt regulation circuit 2700′ can have the same general circuit elements as FIG. 27A, thus like elements are referred to by the same reference characters.

FIG. 27B can differ from FIG. 27A in that it can include erase switch elements 2712-0 and 2712-1. Erase switch element 2712-0 can be situated between shunt node 2710 and current source 2706. In a read or program operation, erase switch element 2712-0 can provide a low impedance path between shunt node 2710 and current source 2706, allowing current to flow from shunt node 2710 through transistor N274. In contrast, in an erase operation, erase switch element 2712-0 can present a high impedance with respect to shunt node 2710, and in the particular example shown, can connect a drain to transistor N274 to a low power supply node VSS, thus disabling the transistor a read or program operation, the other erase switch element 2712-1 can connect an anode of PMC 2702 (which can be common to multiple PMC anodes) to a high power supply node VDD. However, in an erase operation, erase switch element 2712-1 can connect PMC anode(s) to a lower voltage, which in the particular example shown, can be a low power supply node VSS.

In this way, a PMC can be read, programmed, or erased with a single circuit.

It is understood that while some embodiments have shown circuits utilized in a common anode configuration, other embodiments can include corresponding common cathode configurations, and vice versa.

It should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. An integrated circuit, comprising:
   at least one programmable metallization cell (PMC) comprising an ion conducting material and a metal dissolvable in the ion conducting material, selectively connected to a shunt node; and
   a biasing circuit comprising
   a current source coupled to the shunt node configurable to provide a first current in a first type operation, and
   a voltage regulator coupled to the shunt node configured to regulate a potential at the shunt node; wherein
   in the first type operation, the voltage regulator shunts current with respect to the shunt node in a same direction as a current flow of the at least one PMC, and
   the voltage regulator includes
   a regulator amplifier having a first input coupled to a reference voltage and a second input coupled to the shunt node, and an amplifier output, and
   a one-way current supply device coupled to the shunt node configured to provide current in one direction based on a signal from the amplifier output.

2. The integrated circuit of claim 1, wherein:
   the at least one PMC is coupled between a first power supply node and the shunt node and is configured to sink current from the shunt node in the first type operation; and
   the current source is coupled between the shunt node and a second power supply node and configured to provide the first current to the shunt node, and
   the voltage regulator is configured to shunt current from the shunt node and does not source current to the shunt node.

3. The integrated circuit of claim 1, wherein:
   the at least one PMC is coupled between a first power supply node and the shunt node and is configured to source current to the shunt node in the first type operation; and
   the current source is coupled between the shunt node and a second power supply node and is configured to sink the first current from the shunt node, and
   the voltage regulator is configured to source current to the shunt node and does not sink current from the shunt node.

4. The integrated circuit of claim 1, wherein:
   the current source is further configurable to provide a second current in a second type operation; wherein
   the first type operation is a read operation and the second type operation is a program operation, and the first current is less than the second current.

5. The integrated circuit of claim 1, wherein:
   the current source includes a current source transistor having a current path coupled to the shunt node and a control terminal coupled to receive a bias signal that controls the amount of current flowing through the current source transistor.

6. The integrated circuit of claim 1, further including:
   a switch circuit that couples the PMC to a first voltage node in the first type operation, and to an erase voltage node in an erase operation; wherein
   the current source is disabled in the erase operation, and the voltage regulator is configured to provide current with respect to the shunt node in an opposite direction as a current flow of the at least one PMC in the erase operation.

7. The integrated circuit of claim 1, further including:
   a detect circuit coupled to the shunt node configured to activate a sense signal when a potential at the shunt node is outside of a predetermined limit.

8. An integrated circuit, comprising:
   a plurality of memory cells, each including a memory element formed with a solid ion conductor material, and a select device that couples the memory element to a shunt node;
   a voltage source that includes
   an amplifier having a first input coupled to the shunt node, a second input coupled to receive a reference voltage, and an amplifier output, and
   a regulating transistor having a source-drain path coupled between a first power supply voltage and the shunt node, and a gate coupled to the amplifier output; and
   a current source circuit coupled between the shunt node and a second power supply voltage.

9. The integrated circuit of claim 8, wherein:
   the reference voltage has a first value in a read mode of operation that is less than a threshold voltage, and a second value in a program mode of operation that is greater than the threshold voltage; and
   the current source circuit is configured to source a first current in the read mode and second current in the program mode; wherein
   the threshold voltage is the voltage at which a memory element can be programmed from a high impedance state to a low impedance state, and the second current is greater than the first current.

10. The integrated circuit of claim 8, wherein:
    the regulating transistor is a p-type insulated gate field effect transistor, and the first power supply voltage is a high power supply voltage; and
    the current source circuit includes an n-type insulated gate field effect transistor having a source-drain path coupled between the shunt node and a low power supply voltage.

11. The integrated circuit, of claim 8, further including:
    each memory cell having a first memory element coupled to the select device at a first terminal; and
    a first switch element that selectively switches the second terminal of at least one memory element between the first power supply voltage and an erase voltage, less than the first power supply voltage.

12. The integrated circuit, of claim 11, further including:
    a second switch element that selectively switches the shunt node between the current source circuit and the second power supply voltage.

13. The integrated circuit, of claim 8, further including:
    an output section configured to generate an indication in response to the regulating transistor drawing a predetermined amount of current.

* * * * *